United States Patent
Xiao et al.

(10) Patent No.: US 11,876,213 B2
(45) Date of Patent: Jan. 16, 2024

(54) MANUFACTURING PROCESS OF MAKING NEGATIVE ELECTRODES FOR BATTERIES

(71) Applicant: GM GLOBAL TECHNOLOGY OPERATIONS LLC, Detroit, MI (US)

(72) Inventors: Xingcheng Xiao, Troy, MI (US); Xingyi Yang, Sterling Heights, MI (US); Raghunathan K, Troy, MI (US); Mark W. Verbrugge, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 118 days.

(21) Appl. No.: 16/752,192

(22) Filed: Jan. 24, 2020

(65) Prior Publication Data

US 2021/0234153 A1  Jul. 29, 2021

(51) Int. Cl.
| | | |
|---|---|---|
| *H01M 4/139* | (2010.01) | |
| *H01M 10/0525* | (2010.01) | |
| *H01M 4/04* | (2006.01) | |
| *H01M 4/62* | (2006.01) | |
| *C23C 16/455* | (2006.01) | |

(Continued)

(52) U.S. Cl.
CPC ......... *H01M 4/139* (2013.01); *C23C 16/403* (2013.01); *C23C 16/45555* (2013.01); *H01M 4/0428* (2013.01); *H01M 4/0471* (2013.01); *H01M 4/366* (2013.01); *H01M 4/62* (2013.01); *H01M 10/0525* (2013.01); *H01M 2004/027* (2013.01)

(58) Field of Classification Search
CPC .................................................. H01M 4/0428
See application file for complete search history.

(56) References Cited

U.S. PATENT DOCUMENTS

| | | |
|---|---|---|
| 8,440,350 B1 | 5/2013 | Verbrugge et al. |
| 8,859,144 B2 | 10/2014 | Xiao |

(Continued)

FOREIGN PATENT DOCUMENTS

| | | |
|---|---|---|
| CN | 103943819 A | 7/2014 |
| CN | 103966572 A | 8/2014 |

(Continued)

OTHER PUBLICATIONS

Xiao, Xingcheng et al., "Regulated Breathing Effect of Silicon Negative Electrode for Dramatically Enhanced Performance of Li-Ion Battery," Adv. Funct. Mater. (2015) 25, pp. 1426-1433; DOI:10.1002/adfm.201403629.

(Continued)

*Primary Examiner* — Austin Murata
(74) *Attorney, Agent, or Firm* — Harness, Dickey & Pierce, P.L.C.

(57) ABSTRACT

A method of making an electrode material for an electrode in an electrochemical cell that cycles lithium ions is provided, where a protective coating is applied to an electrode precursor material. The electrode precursor may be a silicon-containing composition. The protective coating is selected from the group consisting of: an oxide-based coating, a fluoride-based coating, and a nitride-based coating. The method also includes lithiating the electrode precursor material in a continuous process. The continuous process is conducted in a reactor having a first reaction chamber and a second reaction chamber to form a lithiated electrode material comprising the protective coating.

20 Claims, 7 Drawing Sheets

(51) Int. Cl.
  *H01M 4/36* (2006.01)
  *C23C 16/40* (2006.01)
  *H01M 4/02* (2006.01)

(56) References Cited

U.S. PATENT DOCUMENTS

| | | | |
|---|---|---|---|
| 8,999,584 B2 | 4/2015 | Jiang et al. | |
| 9,005,811 B2 | 4/2015 | Xiao et al. | |
| 9,034,519 B2 | 5/2015 | Xiao et al. | |
| 9,093,705 B2 | 7/2015 | Xiao et al. | |
| 9,142,830 B2 | 9/2015 | Xiao et al. | |
| 9,302,914 B2 | 4/2016 | Liu et al. | |
| 9,362,551 B2 | 6/2016 | Sachdev et al. | |
| 9,379,374 B2 | 6/2016 | Liu et al. | |
| 9,531,004 B2 | 12/2016 | Xiao et al. | |
| 9,564,639 B2 | 2/2017 | Huang | |
| 9,570,752 B2 | 2/2017 | Huang et al. | |
| 9,577,251 B2 | 2/2017 | Xiao et al. | |
| 9,780,361 B2 | 10/2017 | Xiao et al. | |
| 10,062,898 B2 | 8/2018 | Xiao | |
| 10,164,254 B2 | 12/2018 | Mun et al. | |
| 10,826,065 B2* | 11/2020 | Kozen | H01M 4/62 |
| 10,854,882 B2 | 12/2020 | Halalay et al. | |
| 10,978,699 B2 | 4/2021 | Herle et al. | |
| 2012/0141676 A1* | 6/2012 | Sershen | C23C 16/453 427/255.23 |
| 2014/0322613 A1* | 10/2014 | Kitagawa | H01M 4/62 429/232 |
| 2015/0180023 A1* | 6/2015 | Xiao | H01M 4/0423 429/231.8 |
| 2015/0280222 A1* | 10/2015 | Kirkengen | H01M 10/0525 429/231.95 |
| 2015/0332859 A1* | 11/2015 | Gentile | H01G 11/04 427/80 |
| 2016/0218351 A1* | 7/2016 | Dudney | H01M 4/366 |
| 2017/0338522 A1* | 11/2017 | Hu | H01M 50/46 |
| 2018/0205114 A1 | 7/2018 | Pauric et al. | |
| 2019/0198865 A1* | 6/2019 | Kim | H01M 4/628 |
| 2019/0237810 A1* | 8/2019 | Visco | H01M 10/052 |
| 2019/0372096 A1* | 12/2019 | Chae | H01M 4/1391 |
| 2020/0006805 A1* | 1/2020 | Yushin | H01M 4/466 |
| 2020/0020948 A1 | 1/2020 | Huang et al. | |
| 2020/0020949 A1 | 1/2020 | Huang | |
| 2020/0119339 A1 | 4/2020 | Halalay et al. | |
| 2020/0189874 A1* | 6/2020 | Ishikawa | H01M 10/0525 |
| 2020/0220153 A1 | 7/2020 | Xiao et al. | |
| 2020/0220154 A1 | 7/2020 | Xiao et al. | |
| 2020/0358083 A1* | 11/2020 | Patolsky | H01M 10/0525 |
| 2021/0218032 A1* | 7/2021 | Brevnov | C23C 14/34 |
| 2021/0367224 A1* | 11/2021 | Gaben | H01M 4/0428 |

FOREIGN PATENT DOCUMENTS

| | | |
|---|---|---|
| CN | 108604668 A | 9/2018 |
| CN | 110168783 A | 8/2019 |
| CN | 113178546 A | 7/2021 |
| DE | 102020134446 A1 | 7/2021 |
| WO | WO-2019215406 A1 | 11/2019 |
| WO | WO-2019246095 A1 | 12/2019 |

OTHER PUBLICATIONS

Halalay, Ion C. et al., U.S. Appl. No. 16/160,799, filed Oct. 15, 2018 entitled, "Method for Making Silicon-Containing Composite Electrodes for Lithium-Based Batteries," 47 pages.

Xiao, Xingcheng et al., U.S. Appl. No. 16/239,027, filed Jan. 3, 2019 entitled "Method for in Situ Growth of Axial Geometry Carbon Structures in Electrodes," 38 pages.

Xiao, Xingcheng et al., U.S. Appl. No. 16/239,040, filed Jan. 3, 2019 entitled "Electrodes and Methods of Fabricating Electrodes for Electrochemical Cells by Continuous Localized Pyrolysis," 58 pages.

First Office Action for Chinese Patent Application No. 202110512606.3 dated Oct. 20, 2023, with correspondence from China Patent Agent (H.K.) Ltd. summarizing Office Action; 10 pages.

* cited by examiner

MANUFACTURING PROCESS OF MAKING NEGATIVE ELECTRODES FOR BATTERIES

INTRODUCTION

This section provides background information related to the present disclosure which is not necessarily prior art.

The present disclosure pertains to continuous methods of forming prelithiated electroactive materials having protective coatings for use in negative electrodes of lithium ion electrochemical cells.

Lithium ion batteries can be used in a variety of consumer products and vehicles. Typical electrochemically active materials for forming a negative electrode or anode for such batteries include lithium-graphite intercalation compounds, lithium-silicon alloying compounds, lithium-tin alloying compounds, and lithium alloys. While graphite compounds are most common, recently, anode materials with high specific capacity (in comparison with conventional graphite) are of growing interest. For example, silicon has the highest known theoretical charge capacity for lithium, making it one of the most promising materials for rechargeable lithium ion batteries.

However, current negative electrode materials comprising silicon can potentially suffer from significant drawbacks. For example, during an initial lithiation and delithation cycle, the silicon-based electroactive material can undergo excessive volumetric expansion and contraction. Moreover, the initial lithiation process of silicon-based electroactive materials can promote an increase in surface roughness. Further, additional volumetric changes may occur during successive charging and discharging cycles for silicon electroactive materials. Such volumetric changes can lead to fatigue cracking and decrepitation of the electroactive material. This may potentially lead to a loss of electrical contact between the silicon-containing electroactive material and the rest of the battery cell as well as the consumption of electrolyte to form new solid electrolyte interface (SEI), resulting in a decline of electrochemical cyclic performance, diminished Coulombic charge capacity retention (capacity fade), and limited cycle life.

This is especially true at electrode loading levels required for the application of silicon containing electrodes in high-energy lithium ion batteries, such as those used in transportation applications. Accordingly, it would be desirable to develop methods of making electroactive materials comprising silicon or other electroactive materials that undergo significant volumetric changes during lithium ion cycling that are capable of minimal capacity fade and maximized charge capacity in commercial lithium ion batteries with long lifespans, especially for transportation applications.

SUMMARY

This section provides a general summary of the disclosure, and is not a comprehensive disclosure of its full scope or all of its features.

The present disclosure relates to methods of making electrode materials for an electrochemical cell that cycles lithium ions. In certain aspects, the method includes applying a protective coating via an atomic layer deposition (ALD) process onto a negative electrode precursor in a first reaction chamber of a reactor. The negative electrode precursor includes silicon. The protective coating is selected from the group consisting of: an oxide-based coating, a fluoride-based coating, and a nitride-based coating. The method also includes transferring the negative electrode precursor into a second reaction chamber of the reactor and lithiating the negative electrode precursor to form a negative electrode material including the protective coating and the lithium-containing coating.

In one aspect, the protective coating is selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), lithium fluoride (LiF), aluminum fluoride ($AlF_3$), aluminum oxyfluoride (AlFO), aluminum nitride (AlN), silicon nitride (SiN), and combinations thereof.

In one aspect, the protective coating includes aluminum oxide ($Al_2O_3$).

In one aspect, the lithiating occurs by a thermal evaporation process.

In one aspect, the first reaction chamber defines a plurality of deposition regions.

In one further aspect, each of the plurality of deposition regions includes a first zone to introduce an oxidant and a second zone to introduce one or more ALD precursors.

In one aspect, the reactor is a vacuum chamber defining the first reaction chamber and the second reaction chamber.

In one aspect, a thickness of the protective coating is greater than or equal to about 1 nm to less than or equal to about 25 nm.

In one aspect, a thickness of the lithium-containing coating is greater than or equal to about 1 micrometer to less than or equal to about 50 micrometers.

In one aspect, the method is conducted continuously in a roll-to-roll process.

The present disclosure also relates to a method of making an electrode material for an electrode in an electrochemical cell that cycles lithium ions. The method includes applying a protective coating selected from the group consisting of: an oxide-based coating, a fluoride-based coating, and a nitride-based coating to an electrode precursor material. The method further includes lithiating the electrode precursor material, which occurs in a continuous process conducted in a reactor having a first reaction chamber and a second reaction chamber. In this manner, the method forms a lithiated electrode material including the protective coating.

In one aspect, the method further includes applying the protective coating on the electrode precursor material in the first reaction chamber, and lithiating the electrode precursor material in the second reaction chamber. Alternatively, the method includes lithiating the electrode precursor material in the first reaction chamber; and applying the protective coating on the electrode precursor material in the second reaction chamber.

In one aspect, the protective coating is selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), lithium fluoride (LiF), aluminum fluoride ($AlF_3$), aluminum oxyfluoride (AlFO), aluminum nitride (AlN), silicon nitride (SiN), and combinations thereof.

In one aspect, the protective coating includes aluminum oxide ($Al_2O_3$).

In one aspect, the applying the protective coating is an atomic layer deposition (ALD) process.

In one aspect, the first reaction chamber defines a plurality of deposition regions that each includes a first zone to introduce an oxidant and a second zone to introduce one or more ALD precursors.

In one aspect, the lithiating occurs by a thermal evaporation process.

In one aspect, the reactor is a vacuum chamber defining the first reaction chamber and the second reaction chamber.

In one aspect, a thickness of the protective coating is greater than or equal to about 1 nm to less than or equal to about 25 nm. A thickness of the lithium-containing coating is optionally greater than or equal to about 1 micrometer to less than or equal to about 50 micrometers In one aspect, the method is conducted continuously in a roll-to-roll process.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 8:
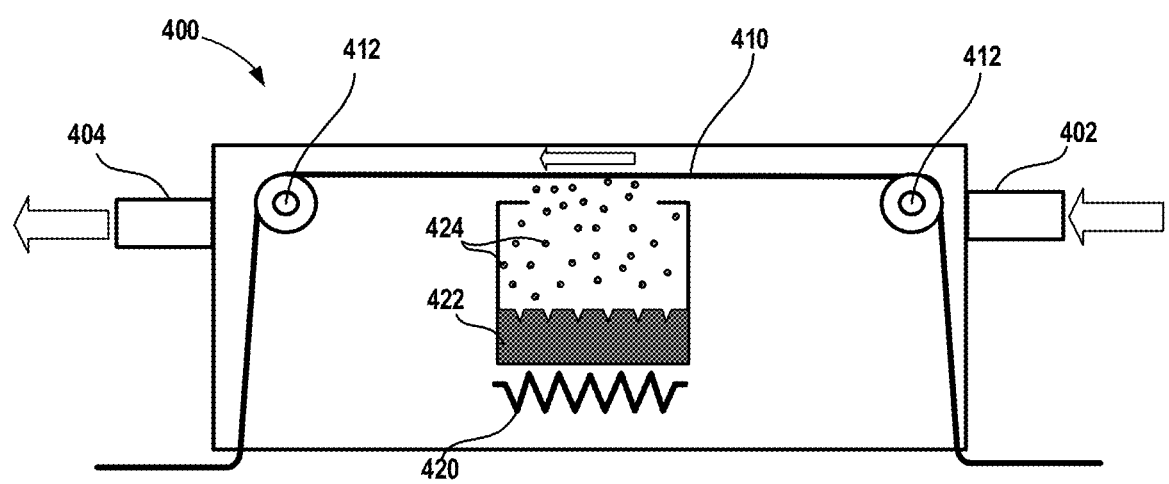
Figure 9:
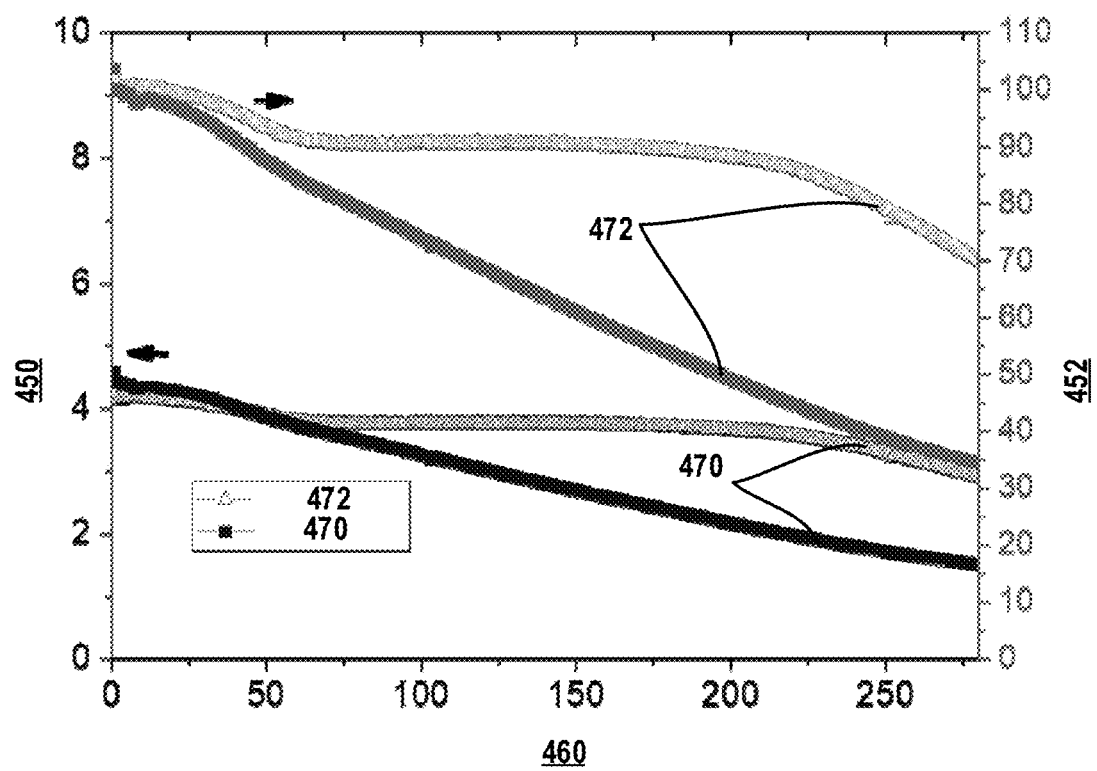

FIG. 8 shows an alternative variation of an illustration of a reactor for conducting a continuous process for forming a negative electroactive material particle having a multilayer coating including a first reaction chamber to apply an ALD protective coating and a second connected reaction chamber to apply a lithium-containing coating via thermal evaporation in accordance with certain aspects of the present disclosure FIG. 9 shows comparative discharge capacity and capacity retention performance of negative electrodes having an uncoated silicon and a silicon particle having a multilayer coating (including a lithium-containing coating and an ALD protective coating) prepared in accordance with certain aspects of the present disclosure.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, the terms "composition" and "material" are used interchangeably to refer broadly to a substance containing at least the preferred chemical constituents, elements, or compounds, but which may also comprise additional elements, compounds, or substances, including trace amounts of impurities, unless otherwise indicated.

Example embodiments will now be described more fully with reference to the accompanying drawings.

The present disclosure provides methods of making improved electrodes (and electrochemical cells including the improved electrodes) that enhance robustness and integrity of the active materials in the electrode, while reducing operational inefficiencies resulting from, for example, loss of active lithium ions during the first cell cycle. In particular, the present disclosure provides methods of concurrently lithiating an electroactive material (e.g., a silicon-based composition) of an electrode, for example pre-lithiating an electroactive material, and also applying a mechanically protective coating to the electroactive material. The method may be conducted in a reactor having distinct reaction chambers. In this manner, the process of lithiation and applying the protective coating can be done concurrently without exposing the electrode/active materials to atmosphere, which saves time to eliminate the need to pump down the chambers while improving the quality of electrode formed. The lithiation creates a lithium reservoir in the negative electrode of the cell. The reserved lithium compensates for lithium lost during cycling, including during the first cycle, of the electrochemical cell so as to decrease capacity loss over time. The protective coating reduces mechanical degradation and minimizes any increases in surface roughness during initial and subsequent lithiation/delithiation cycles.

A typical lithium-ion battery includes a first electrode (such as a positive electrode or cathode) opposing a second electrode (such as a negative electrode or anode) and a separator and/or electrolyte disposed therebetween. Often, in a lithium-ion battery pack, batteries or cells may be electrically connected in a stack or winding configuration to increase overall output. Lithium-ion batteries operate by reversibly passing lithium ions between the first and second electrodes. For example, lithium ions may move from a positive electrode to a negative electrode during charging of the battery, and in the opposite direction when discharging the battery. The electrolyte is suitable for conducting lithium ions and may be in liquid, gel, or solid form.

Figure 1:
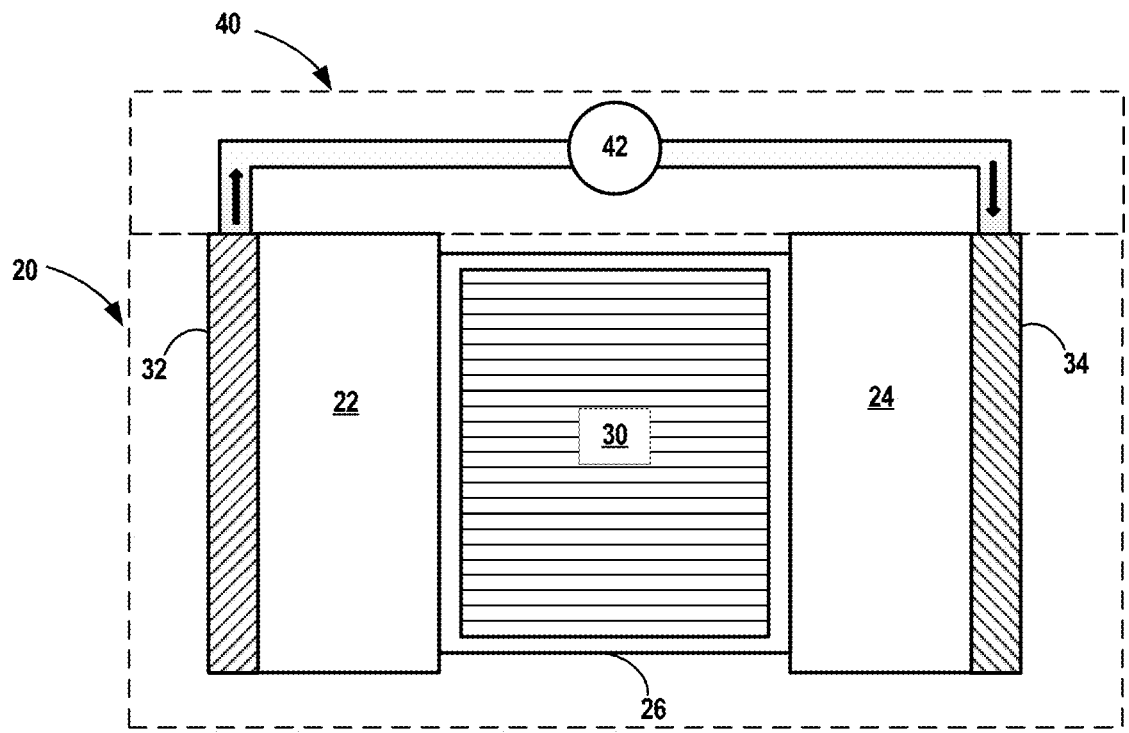
FIG. 1 is a schematic of an example electrochemical battery cell.

For example, an exemplary and schematic illustration of an electrochemical cell (also referred to as the battery) 20 is shown in FIG. 1. Although the illustrated examples include a single cathode and a single anode, the skilled artisan will recognize that the present disclosure also contemplates various other configurations, including those having one or more cathodes and one or more anodes, as well as various current collectors with electroactive layers disposed on or adjacent to one or more surfaces thereof. The battery 20 includes a negative electrode 22 (e.g., anode), a positive electrode 24 (e.g., cathode), and a separator 26 (e.g., a microporous polymeric separator) disposed between the two electrodes 22, 24. The separator 26 comprises an electrolyte 30, which may also be present in the negative electrode 22 and positive electrode 24. A negative electrode current collector 32 may be positioned at or near the negative electrode 22 and a positive electrode current collector 34 may be positioned at or near the positive electrode 24. An interruptible external circuit 40 and a load device 42 connects the negative electrode 22 (through its current collector 32) and the positive electrode 24 (through its current collector 34).

The battery 20 can generate an electric current during discharge by way of reversible electrochemical reactions that occur when the external circuit 40 is closed (to connect the negative electrode 22 and the positive electrode 24) and the negative electrode 22 has a lower potential than the positive electrode. The chemical potential difference between the positive electrode 24 and the negative electrode 22 drives electrons produced by a reaction, for example, the oxidation of intercalated lithium, at the negative electrode 22 through the external circuit 40 towards the positive electrode 24. Lithium ions that are also produced at the negative electrode 22 are concurrently transferred through the electrolyte 30 contained in the separator 26 towards the positive electrode 24. The electrons flow through the external circuit 40 and the lithium ions migrate across the separator 26 containing the electrolyte solution 30 to form intercalated lithium at the positive electrode 24. As noted above, electrolyte 30 is typically also present in the negative electrode 22 and positive electrode 24. The electric current passing through the external circuit 40 can be harnessed and directed through the load device 42 until the lithium in the negative electrode 22 is depleted and the capacity of the battery 20 is diminished.

The battery 20 can be charged or re-energized at any time by connecting an external power source to the lithium ion battery 20 to reverse the electrochemical reactions that occur during battery discharge. Connecting an external electrical energy source to the battery 20 promotes a reaction, for example, non-spontaneous oxidation of intercalated lithium, at the positive electrode 24 so that electrons and lithium ions are produced. The lithium ions flow back towards the negative electrode 22 through the electrolyte 30 across the separator 26 to replenish the negative electrode 22 with lithium (e.g., intercalated lithium) for use during the next battery discharge event. As such, a complete discharging event followed by a complete charging event is considered to be a cycle, where lithium ions are cycled between the positive electrode 24 and the negative electrode 22. The external power source that may be used to charge the battery 20 may vary depending on the size, construction, and particular end-use of the battery 20. Some notable and exemplary external power sources include, but are not limited to, an AC-DC converter connected to an AC electrical power grid though a wall outlet and a motor vehicle alternator.

In many lithium-ion battery configurations, each of the negative electrode current collector 32, negative electrode 22, the separator 26, positive electrode 24, and positive electrode current collector 34 are prepared as relatively thin layers (for example, from several microns to a fraction of a millimeter or less in thickness) and assembled in layers connected in electrical parallel arrangement to provide a suitable electrical energy and power package. The negative electrode current collector 32 and positive electrode current collector 34 respectively collect and move free electrons to and from an external circuit 40.

Further, the separator 26 operates as an electrical insulator by being sandwiched between the negative electrode 22 and the positive electrode 24 to prevent physical contact and thus, the occurrence of a short circuit. The separator 26 provides not only a physical and electrical barrier between the two electrodes 22, 24, but also contains the electrolyte solution in a network of open pores during the cycling of lithium ions, to facilitate functioning of the battery 20.

Furthermore, the battery 20 can include a variety of other components that while not depicted here are nonetheless known to those of skill in the art. For instance, the battery 20 may include a casing, gaskets, terminal caps, tabs, battery terminals, and any other conventional components or materials that may be situated within the battery 20, including between or around the negative electrode 22, the positive electrode 24, and/or the separator 26. The battery 20 shown in FIG. 1 includes a liquid electrolyte 30 and shows representative concepts of battery operation. However, the battery 20 may also be a solid-state battery that includes a solid-state electrolyte that may have a different design, as known to those of skill in the art.

As noted above, the size and shape of the battery 20 may vary depending on the particular application for which it is designed. Battery-powered vehicles and hand-held consumer electronic devices, for example, are two examples where the battery 20 would most likely be designed to different size, capacity, and power-output specifications. The battery 20 may also be connected in series or parallel with other similar lithium-ion cells or batteries to produce a greater voltage output, energy, and power if it is required by the load device 42. Accordingly, the battery 20 can generate electric current to a load device 42 that is part of the external circuit 40. The load device 42 may be powered by the electric current passing through the external circuit 40 when the battery 20 is discharging. While the electrical load device 42 may be any number of known electrically-powered devices, a few specific examples include an electric motor for an electrified vehicle, a laptop computer, a tablet computer, a cellular phone, and cordless power tools or appliances. The load device 42 may also be an electricity-generating apparatus that charges the battery 20 for purposes of storing electrical energy.

The present technology pertains to improved electrochemical cells, especially lithium-ion batteries. In various instances, such cells are used in vehicle or automotive transportation applications (e.g., motorcycles, boats, tractors, buses, motorcycles, mobile homes, campers, and tanks). However, the present technology may be employed in a wide variety of other industries and applications, including aerospace components, consumer goods, devices, buildings (e.g., houses, offices, sheds, and warehouses), office equipment and furniture, and industrial equipment machinery, agricultural or farm equipment, or heavy machinery, by way of non-limiting example.

With renewed reference to FIG. 1, the positive electrode 24, the negative electrode 22, and the separator 26 may each include an electrolyte solution or system 30 inside their pores, capable of conducting lithium ions between the negative electrode 22 and the positive electrode 24. Any appropriate electrolyte 30, whether in solid, liquid, or gel form, capable of conducting lithium ions between the negative electrode 22 and the positive electrode 24 may be used in the lithium-ion battery 20. In certain aspects, the electrolyte 30 may be a non-aqueous liquid electrolyte solution that includes a lithium salt dissolved in an organic solvent or a mixture of organic solvents. Numerous conventional non-aqueous liquid electrolyte 30 solutions may be employed in the lithium-ion battery 20.

In certain aspects, the electrolyte 30 may be a non-aqueous liquid electrolyte solution that includes one or more lithium salts dissolved in an organic solvent or a mixture of organic solvents. For example, a non-limiting list of lithium salts that may be dissolved in an organic solvent to form the non-aqueous liquid electrolyte solution include lithium hexafluorophosphate ($LiPF_6$), lithium perchlorate ($LiClO_4$), lithium tetrachloroaluminate (LiAlCl$_4$), lithium iodide (LiI), lithium bromide (LiBr), lithium thiocyanate (LiSCN), lithium tetrafluoroborate (LiBF$_4$), lithium tetraphenylborate (LiB(C$_6$H$_5$)$_4$), lithium bis(oxalato)borate (LiB(C$_2$O$_4$)$_2$) (LiBOB), lithium difluorooxalatoborate (LiBF$_2$(C$_2$O$_4$)), lithium hexafluoroarsenate (LiAsF$_6$), lithium trifluoromethanesulfonate (LiCF$_3$SO$_3$), lithium bis(trifluoromethane) sulfonylimide (LiN(CF$_3$SO$_2$)$_2$), lithium bis(fluorosulfonyl) imide (LiN(FSO$_2$)$_2$) (LiSFI), and combinations thereof.

These and other similar lithium salts may be dissolved in a variety of non-aqueous aprotic organic solvents, including but not limited to, various alkyl carbonates, such as cyclic carbonates (e.g., ethylene carbonate (EC), propylene carbonate (PC), butylene carbonate (BC), fluoroethylene carbonate (FEC)), linear carbonates (e.g., dimethyl carbonate (DMC), diethyl carbonate (DEC), ethylmethylcarbonate (EMC)), aliphatic carboxylic esters (e.g., methyl formate, methyl acetate, methyl propionate), γ-lactones (e.g., γ-butyrolactone, γ-valerolactone), chain structure ethers (e.g., 1,2-dimethoxyethane, 1-2-diethoxyethane, ethoxymethoxyethane), cyclic ethers (e.g., tetrahydrofuran, 2-methyltetrahydrofuran), 1,3-dioxolane), sulfur compounds (e.g., sulfolane), and combinations thereof.

The porous separator 26 may include, in certain instances, a microporous polymeric separator including a polyolefin. The polyolefin may be a homopolymer (derived from a single monomer constituent) or a heteropolymer (derived from more than one monomer constituent), which may be either linear or branched. If a heteropolymer is derived from two monomer constituents, the polyolefin may assume any copolymer chain arrangement, including those of a block copolymer or a random copolymer. Similarly, if the polyolefin is a heteropolymer derived from more than two monomer constituents, it may likewise be a block copolymer or a random copolymer. In certain aspects, the polyolefin may be polyethylene (PE), polypropylene (PP), or a blend of PE and PP, or multi-layered structured porous films of PE and/or PP. Commercially available polyolefin porous separator membranes 26 include CELGARD® 2500 (a monolayer polypropylene separator) and CELGARD® 2320 (a trilayer polypropylene/polyethylene/polypropylene separator) available from Celgard LLC.

In certain aspects, the separator 26 may further include one or more of a ceramic coating layer and a heat-resistant material coating. The ceramic coating layer and/or the heat-resistant material coating may be disposed on one or more sides of the separator 26. The material forming the ceramic layer may be selected from the group consisting of: alumina (Al$_2$O$_3$), silica (SiO$_2$), and combinations thereof. The heat-resistant material may be selected from the group consisting of: Nomex, Aramid, and combinations thereof.

When the separator 26 is a microporous polymeric separator, it may be a single layer or a multi-layer laminate, which may be fabricated from either a dry or a wet process. For example, in certain instances, a single layer of the polyolefin may form the entire separator 26. In other aspects, the separator 26 may be a fibrous membrane having an abundance of pores extending between the opposing surfaces and may have an average thickness of less than a millimeter, for example. As another example, however, multiple discrete layers of similar or dissimilar polyolefins may be assembled to form the microporous polymer separator 26. The separator 26 may also comprise other polymers in addition to the polyolefin such as, but not limited to, polyethylene terephthalate (PET), polyvinylidene fluoride (PVdF), a polyamide, polyimide, poly(amide-imide) copolymer, polyetherimide, and/or cellulose, or any other material suitable for creating the required porous structure. The polyolefin layer, and any other optional polymer layers, may further be included in the separator 26 as a fibrous layer to help provide the separator 26 with appropriate structural and porosity characteristics. In certain aspects, the separator 26 may also be mixed with a ceramic material or its surface may be coated in a ceramic material. For example, a ceramic coating may include alumina (Al$_2$O$_3$), silicon dioxide (SiO$_2$), titania (TiO$_2$) or combinations thereof. Various conventionally available polymers and commercial products for forming the separator 26 are contemplated, as well as the many manufacturing methods that may be employed to produce such a microporous polymer separator 26.

In various aspects, the porous separator 26 and the electrolyte 30 in FIG. 1 may be replaced with a solid-state electrolyte (SSE) (not shown) that functions as both an electrolyte and a separator. The SSE may be disposed between the positive electrode 24 and negative electrode 22. The SSE facilitates transfer of lithium ions, while mechanically separating and providing electrical insulation between the negative and positive electrodes 22, 24. By way of non-limiting example, SSEs may include LiTi$_2$(PO4)$_3$, LiGe$_2$(PO$_4$)$_3$, Li$_7$La$_3$Zr$_2$O$_{12}$, Li$_{3x}$La$_{2/3}$-xTiO$_3$, Li$_3$PO$_4$, Li$_3$N, Li$_4$GeS$_4$, Li$_{10}$GeP$_2$S$_{12}$, Li$_2$S—P$_2$S$_5$, Li$_6$PS$_5$Cl, Li$_6$PS$_5$Br, Li$_6$PS$_5$I, Li$_3$OCl, Li$_{2.99}$Ba$_{0.005}$ClO, or combinations thereof.

The positive electrode 24 may be formed from a lithium-based active material that can sufficiently undergo lithium intercalation and deintercalation, or alloying and dealloying, while functioning as the positive terminal of the battery 20. One exemplary common class of known materials that can be used to form the positive electrode 24 is layered lithium transitional metal oxides. For example, in certain aspects, the positive electrode 24 may comprise one or more materials having a spinel structure, such as lithium manganese oxide (Li$_{(1+x)}$Mn$_2$O$_4$, where 0.1≤x≤1), lithium manganese nickel oxide (LiMn$_{(2-x)}$Ni$_x$O$_4$, where 0≤x≤0.5) (e.g., LiMn$_{1.5}$Ni$_{0.5}$O$_4$); one or more materials with a layered structure, such as lithium cobalt oxide (LiCoO$_2$), lithium nickel manganese cobalt oxide (Li(Ni$_x$Mn$_y$Co$_z$)O$_2$, where 0≤x≤1, 0≤y≤1, 0≤z≤1, and x+y+z=1) (e.g., LiMn$_{0.33}$Ni$_{0.33}$Co$_{0.33}$O$_2$), or a lithium nickel cobalt metal oxide (LiNi$_{(1-x-y)}$Co$_x$M$_y$O$_2$, where 0≤x≤0.2, y≤0.2, and M may be Al, Mg, Ti, or the like); or a lithium iron polyanion oxide with olivine structure, such as lithium iron phosphate (LiFePO$_4$), lithium manganese-iron phosphate (LiMn$_{2-x}$Fe$_x$PO$_4$, where 0<x<0.3), or lithium iron fluorophosphate (Li$_2$FePO$_4$F).

In certain variations, the positive electroactive materials may be intermingled with an electronically conducting material that provides an electron conduction path and/or at least one polymeric binder material that improves the structural integrity of the electrode. For example, the electroactive materials and electronically or electrically conducting materials may be slurry cast with such binders, like polyvinylidene difluoride (PVdF), polytetrafluoroethylene (PTFE), ethylene propylene diene monomer (EPDM) rubber, or carboxymethyl cellulose (CMC), a nitrile butadiene rubber (NBR), styrene-butadiene rubber (SBR), lithium polyacrylate (LiPAA), sodium polyacrylate (NaPAA), sodium alginate, or lithium alginate. Electrically conducting materials may include carbon-based materials, powdered nickel or other metal particles, or a conductive polymer. Carbon-based materials may include, for example, particles of graphite, acetylene black (such as KETCHEN™ black or DENKA™ black), carbon fibers and nanotubes, graphene, and the like. Examples of a conductive polymer include polyaniline, polythiophene, polyacetylene, polypyrrole, and the like. In certain aspects, mixtures of the conductive materials may be used. The positive electrode current collector 34 may be formed from aluminum (Al) or any other appropriate electrically conductive material known to those of skill in the art.

The negative electrode 22 includes an electroactive material as a lithium host material capable of functioning as a negative terminal of a lithium ion battery. The negative electrode current collector 32 may comprise a metal comprising copper, nickel, or alloys thereof or other appropriate electrically conductive materials known to those of skill in the art. In certain aspects, the positive electrode current collector 34 and/or negative electrode current collector 32 may be in the form of a foil, slit mesh, and/or woven mesh.

In certain aspects, the present disclosure provides methods of making negative electrodes 22 (e.g., anodes) that incorporate improved electrochemically active negative electrode materials. As discussed above, certain negative electroactive materials suffer from significant volumetric expansion during lithium cycling (e.g., capable of accepting the insertion of lithium ions during charging of the electrochemical cell via lithiation or "intercalation" and releasing lithium ions during discharging of the electrochemical cell via delithiation or "deintercalation" or lithium alloying/dealloying). Such an electrochemically active negative electrode material may be selected from the group consisting of: silicon, silicon-containing alloys, tin-containing alloys, and combinations thereof. By way of example, electroactive material particles comprising silicon may include silicon, or silicon containing binary and ternary alloys and/or tin-containing alloys, such as Si—Sn, SiSnFe, SiSnAl, SiFeCo, $SnO_2$, and the like. In accordance with various aspects of the present teachings, a negative electroactive material can be incorporated into a negative electrode in an electrochemical cell.

Furthermore, in a typical manufacturing process, a negative electrode material is incorporated into the electrochemical cell without any lithium. The positive electrode has lithium and after cycling the electrochemical cell, lithium passes into and lithiates the negative electrode. However, in negative electroactive materials including silicon, for example, a portion of the lithium may not cycle back through the electrolyte to the positive electrode, but instead may remain with the negative electrode following the first lithiation cycle. This may be due to for example, formation of $Li_xSi$ and/or a solid electrolyte interphase (SEI) layer on the negative electrode, as well as ongoing lithium loss due to continuous solid electrolyte interphase (SEI) breakage. The solid electrolyte interface (SEI) layer can form over the surface of the negative electrode (anode), which is often generated by reaction products of anode material, electrolyte reduction, and/or lithium ion reduction. Such permanent loss of lithium ions may result in a decreased specific energy and power in the battery resulting from added positive electrode mass that does not participate in the reversible operation of the battery. For example, the lithium-ion battery may experience an irreversible capacity loss of greater than or equal to about 5% to less than or equal to about 40% after the first cycle. More specifically, silicon oxides (SiOx) can consume up to 40% total capacity due to the conversion reaction at the first cycle. A silicon electrode, depending on specific surface area, has around 20 to 40% capacity loss due to SEI formation.

Lithiation, for example pre-lithiation of the electroactive materials prior to incorporation into an electrochemical cell, may compensate for such lithium losses during cycling. Common lithiation methods, such as electrochemical, direct contact, and lamination methods, however, can be inefficient and often require half-cell fabrication and teardown and/or high temperature chemical processes. Furthermore, it can be difficult to control an extent of lithiation that occurs during these processes. The present disclosure provides improved electroactive and electrode materials, and methods of making the same, which can address these challenges.

In various aspects, the present disclosure provides advantages, including reducing mechanical stress in negative electrodes by pre-lithiating electroactive materials (or electrodes incorporating electroactive materials) prior to forming the electrode. Notably, the electroactive materials or electrodes incorporating the electroactive materials can be coated with a protective coating and pre-lithiated in a continuous process in a single reactor with multiple distinct reaction chambers. As such, the active lithium loss during formation cycles can be significantly reduced by the present technology. Additionally, cycle life performance of lithium ion batteries incorporating negative electrodes with negative electroactive materials comprising pre-lithiated silicon having a mechanically protective coating is improved in accordance with certain aspects of the present disclosure.

Thus, in accordance with certain aspects of the present disclosure, methods are provided for making an electrode material, such as a negative electrode material comprising silicon, for an electrochemical cell that cycles lithium ions.

In certain aspects, a method of making an electrode material for an electrode in an electrochemical cell that cycles lithium ions is contemplated that involves applying a protective coating selected from the group consisting of: an oxide-based coating, a fluoride-based coating, and a nitride-based coating to an electrode precursor material. The method also comprises lithiating the electrode precursor material. The applying of the protective coating and the lithiating are conducted in a continuous process in a reactor having a first reaction chamber and a second reaction chamber to form a lithiated electrode material comprising the coating. In certain variations, the electrode precursor material may be a negative electrode precursor that comprises silicon, silicon containing binary and ternary alloys, and/or tin-containing alloys. As will be discussed in greater detail below, the electrode precursor material that is treated by the process may be a plurality of electroactive material particles that are lithiated and have the protective coating applied in a continuous process in a reactor or may be a pre-formed electrode comprising the electroactive material (e.g., in a pre-formed composite electrode where the electroactive material is distributed in a polymeric matrix).

Figure 2:
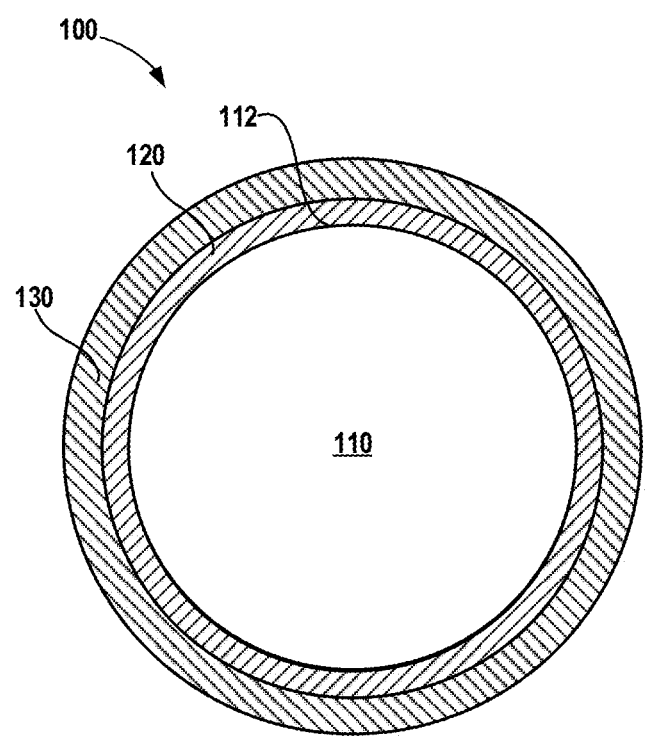
FIG. 2 is an illustration of a cross-sectional view of a negative electroactive material particle having a multilayer coating (including a lithium-containing coating and an atomic layer deposition (ALD) protective coating) prepared in accordance with certain aspects of the present disclosure.

For example, as shown in FIG. 2, a negative electroactive particle 100 comprising a silicon-containing material forms a core region 110 that is capable of undergoing a significant volume expansion during lithium cycling, for example, during lithium ion intercalation or lithium alloying. In an initial state prior to any lithium ion insertion or reaction, the core region 110 is in a first contracted state. After lithium ion insertion/intercalation or alloying, the particle 100 will be in a second expanded state having a much greater volume (not shown). For example, where the core region 110 is a silicon particle (Si) in the first contracted state, after lithium ion insertion it forms $Li_{4.4}Si$ (corresponding to the second expanded state). The volume of a silicon particle defining the core region 110 after lithium insertion in the second expanded state may be up to three (3) times (300%) larger than the volume of silicon particle in the first contracted state. As will be appreciated, the first contracted state may correspond to the volume of the core region 110 before lithium insertion or after lithium extraction. For a conventional silicon electroactive material, the extent of volumetric expansion that occurs can cause the silicon particle to mechanically degrade and break into a plurality of smaller fragments or pieces. When the particle breaks into smaller pieces, these fragments or smaller pieces can no longer maintain performance of the electrochemical cell.

By way of non-limiting example, electroactive particles comprising silicon that form the core region 110 may have an average particle size (D50) in a contracted state ranging from greater than or equal to about 10 nm to less than or equal to about 50 μm, optionally greater than or equal to about 50 nm to less than or equal to about 10 μm, and in certain variations, ranging from greater than or equal to about 150 nm to less than or equal to about 5 μm.

The negative electroactive particle 100 includes the core region 110 having a surface 112. It should be noted that the features in FIG. 2 are not necessarily shown to scale, but rather are merely provided for purposes of illustration. A protective coating 120 is disposed over the surface 112, which as will be described further below, may have continuous surface coverage. In various aspects, the protective coating 120 is a thin continuous layer applied to the surface 112 of the negative electroactive material particle 100 to provide sufficient coverage to protect the underlying electroactive material during volumetric size changes to minimize or avoid cracking, fracture, decrepitation of the electroactive material during lithium cycling and thus minimizing capacity loss and poor cycle life. The application of the protective coating 120 can serve to enhance mechanical integrity at electrode level, suppress electrolyte decomposition, and facilitate charge transfer. Further, the presence of the protective coating can better passivate the electrode after prelithiation occurs and serves to minimize increases in surface roughness. In certain aspects, a continuous protective coating 120 may be one that covers greater than or equal to about 90% to less than or equal to about 100% of the exposed surface area of the electroactive material and in certain aspects, optionally greater than or equal to about 95% to less than or equal to about 100%, and optionally greater than or equal to about 99% to less than or equal to about 100% of the exposed surface area of the electroactive material.

The protective coating 120 may be formed of a material selected from the group consisting of: an oxide-based coating, a fluoride-based coating, and a nitride-based coating. In certain aspects, as will be described further below, the protective coating 120 comprises a metal. In certain variations, the protective coating 120 comprises a metal selected from the group consisting of: aluminum (Al), titanium (Ti), tin (Sn), zirconium (Zr), vanadium (V), hafnium (Hf), zinc (Zn), silicon (Si), lithium (Li), and combinations thereof. The protective coating 120 is capable of minimizing or preventing fracturing of the negative electrode material 100 during lithium ion cycling. The protective coating 120 may be selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), lithium fluoride (LiF), aluminum fluoride ($AlF_3$), aluminum oxyfluoride (AlFO), aluminum nitride (AlN), silicon nitride (SiN), and combinations thereof. In certain variations, the protective coating 120 may have a thickness of greater than or equal to about 1 nm to less than or equal to about 25 nm; optionally greater than or equal to about 2 nm to less than or equal to about 20 nm, and in certain variations, optionally greater than or equal to about 3 nm to less than or equal to about 10 nm, for example, about 5 nm.

A lithiated layer 130 is disposed over the protective coating 120 on the surface 112. It should be noted that the lithiated layer 130 may in fact migrate below the protective coating 120 into pores at the surface 112 of the negative electroactive particle 100 to react with silicon. Thus, the treated negative electroactive particle 100 may not necessarily have delineated layers as shown, but may in fact have a hybridized and treated surface 112, where a portion of the lithium has migrated below the protective coating 120 to react and alloy with silicon at the surface and penetrating into the core region 110.

In certain variations, the present disclosure contemplates a method of making an electrode material, such as a negative electrode material, for an electrochemical cell that cycles lithium ions. The method may be conducted in a reactor 140 like that shown in FIG. 3. The reactor 140 includes a first reaction chamber 142 and a second reaction chamber 144 that permit a material to pass therebetween (e.g., via a conveyor or roll-to-roll process). In the first reaction chamber 142, a coating is applied to an electrode precursor, for example, a silicon-containing precursor. The coating may be selected from the group consisting of: an oxide-based coating, a fluoride-based coating, and a nitride-based coating.

In certain variations, the applying of the surface coating can be conducted by an atomic layer deposition (ALD). An atomic layer deposition (ALD) process can coat the electrode material with a conformal layer that comprises the protective layer, such as aluminum oxide ($Al_2O_3$). ALD is a self-limiting process for chemical deposition or growth of ultra-thin films on a substrate. ALD typically involves subjecting the target substrate to self-saturating surface reactions. The surface reactions may be conducted sequentially and/or in an alternating fashion, depending on the composition and structure of the film desired. In certain other alternative variations, a protective surface coating can be synthesized on the electrode material by other processes, like physical vapor deposition (PVD) (e.g., magnetron sputtering), chemical vapor deposition (CVD) or thermal process, chemical vapor infiltration, and other known conventional processes to continuously apply such coatings to solid materials.

Figure 3:
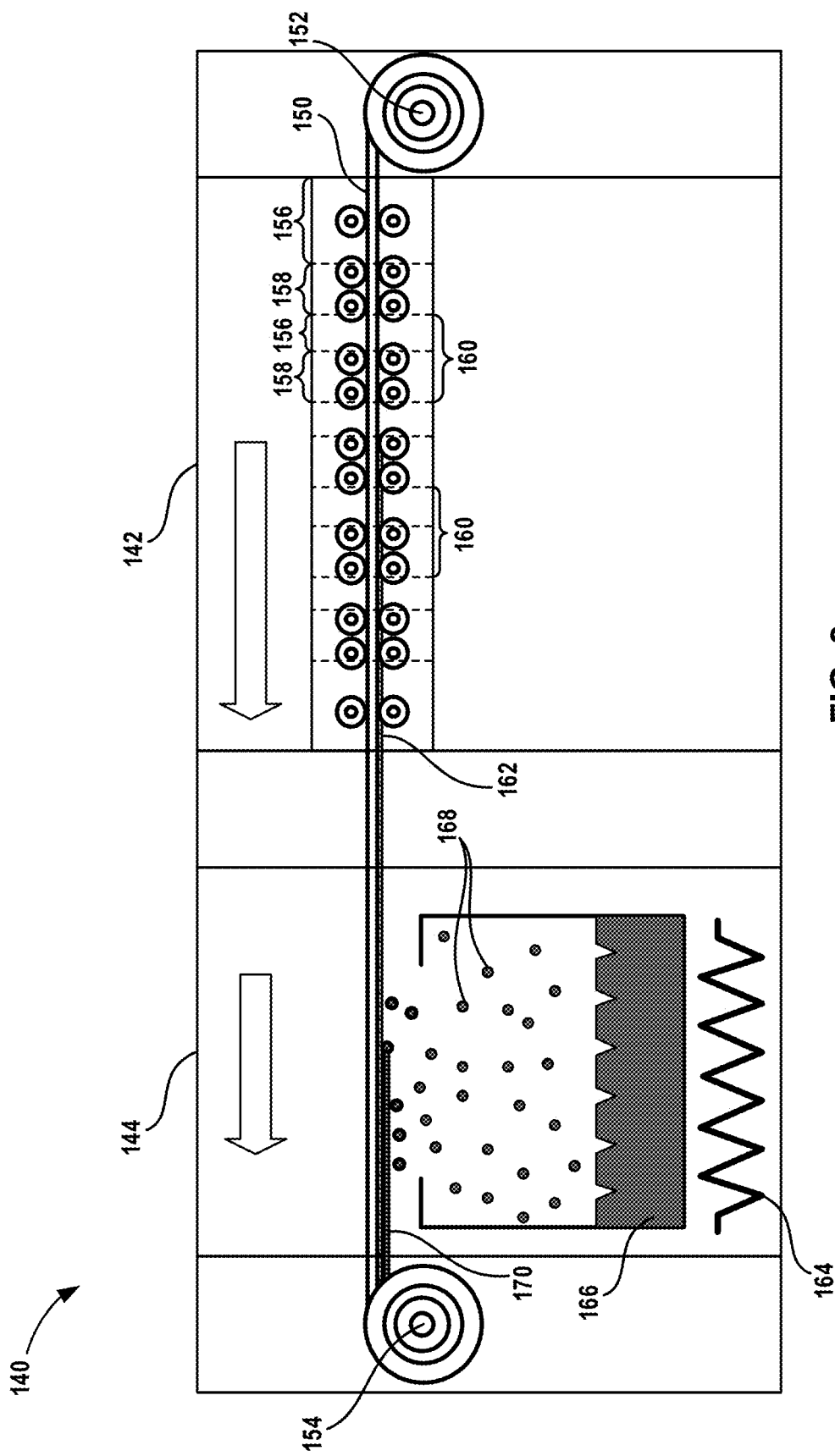
FIG. 3 is an illustration of a reactor for conducting a continuous process for forming a negative electroactive material particle having a multilayer coating including a first reaction chamber to apply an ALD protective coating and a second connected reaction chamber to apply a lithium-containing coating via thermal evaporation in accordance with certain aspects of the present disclosure.

As shown in FIG. 3, the first reaction chamber 142 is used to conduct an ALD process to applying a protective coating. FIG. 3 shows an example of a roll-to-roll continuous process, where an electrode precursor material 150 is unrolled from a first reel or roll 152, is introduced into the reactor 140, is transported through the first and second reaction chambers 142,144 to a second roll 154, where it is spooled again. As will be appreciated, the electrode precursor material 150 may be an elongated sheet of prefabricated electrode material, which may be spooled and unrolled as shown, or alternatively, may be discrete sheets that are transported on a conveyor or a plurality of electroactive material particles conveyed on a belt that may be distributed onto the conveyer and collected after treatment in the reactor 140. The first reaction chamber 142 includes first zones 156 and second zones 158 that are arranged in an alternating fashion in the first reaction chamber 142. A gas or vapor comprising an oxidant, such as oxygen or water, is introduced into each of the first zones 156. One or more ALD precursors, as will be discussed further herein, are introduced into each of the second zones 158. Each first zone 156 and second zone 158 together define one deposition region 160. As the electrode precursor material 150 passes through one first zone 156 and then one second zone 158 in one deposition region 160, a first layer of a protective first coating 162 is applied to the electrode precursor material 150. As will be appreciated by those of skill in the art, the number of deposition regions 160 having alternating first and second zones 156, 158 determines a thickness of the coating deposited, where a greater number of deposition regions results in a thicker first coating 162. Thus, the number of deposition regions 160 in the first reaction chamber 142 will be determined by a desired number of ALD cycles (and desired thickness of the coating). For example, as shown, 5 cycles corresponding to 5 deposition regions can provide the protective first coating 162 with a desired thickness in the ranges discussed above.

In certain variations, the protective first coating 162 is an oxide-based surface coating, which is applied with precursors to form an oxide-containing coating. In certain embodiments, the oxide-based surface coating is selected from the group consisting of: aluminum oxide ($Al_2O_3$), titanium oxide ($TiO_2$), vanadium oxide ($V_2O_5$), silicon oxides (e.g., silicon dioxide ($SiO_2$)), and aluminum oxyfluoride (AlFO). Such oxide-based surface coatings may be formed by using one or more precursors for aluminum oxide ($Al_2O_3$), titanium oxide ($TiO_2$), vanadium oxide ($V_2O_5$), and/or silicon oxide ($SiO_2$) materials. In certain other embodiments, the oxide-based surface coating comprises a material aluminum oxide ($Al_2O_3$). Such an oxide-based surface coating may be formed by using one or more precursors for an aluminum oxide ($Al_2O_3$) coating.

In other variations, a protective first coating 162 on the electrode material or electrode material particles comprises a fluoride-based coating or a nitride-based coating. By fluoride-based coating, it is meant that the coating is applied with precursors to form a fluoride-containing coating. In certain embodiments, the fluoride-based coating may comprise lithium fluoride (LiF), aluminum fluoride ($AlF_3$), or aluminum oxyfluoride (AlFO), by way of example. Such a concept similarly applies to nitride-based coatings, which may likewise contain oxygen-containing species. In certain embodiments, the nitride-based coating may comprise aluminum nitride (AlN) or silicon nitride (SiN).

In various aspects, such a protective first coating 162 is applied to an electrode material by an atomic layer deposition (ALD) process that can coat the electrode material with a conformal layer that comprises the oxide-based layer, such as aluminum oxide ($Al_2O_3$). ALD is typically conducted in an apparatus having a vacuum deposition chamber with a holder or conveyor for the substrate, at least one vapor source (known as the precursor that can be introduced via ports into the reactor) and various controls by which the substrate may be individually subjected to the vapor source. Such controls may include heaters, coolers, flow routing and valves, for controlling the amount of exposure of the substrate to the vapor source, which are not shown in FIG. 3. The regions of the electrode material to be coated may be pretreated, for example, by plasma treatment.

The ALD process for deposition of surface coating onto regions of the electrode material involves reaction of the surface in a deposition chamber with a single vapor of precursor materials or reaction of the surface with multiple vapors introduced sequentially and having the precursors of the surface coating. Suitable precursors may include organic and inorganic metallic compounds, such as trimethylaluminum (TMA). The vapor may be pulsed into the vacuum deposition chamber on a carrier gas and may be quickly purged, for example, by vacuum pumping or flushing with an inert gas. Such pulsing of the vapor and purging of the system may be performed to control the dose of the precursor vapor to which the substrate is exposed.

Generally, the ALD process is performed at elevated temperatures and reduced pressures. Temperature of the deposition chamber is desirably high enough that reaction between the substrate and the precursors in the vapor occurs, while also preventing condensation of the vapor onto the surface. As non-limiting examples, the reaction space in the deposition chamber (first reaction chamber 142) may be heated to between about 150° C. and about 600° C., and the operating pressure may be between about $7.5 \times 10^{-2}$ Torr and about 4 Torr (about 1 Pa to about 5000 Pa).

As a result of ALD process and surface reactions, a single atomic layer of the surface coating material is bound to the electrode surface, thereby providing a monoatomic coating. With sequential or alternating reactions, composite layers may be formed. Furthermore, additional atomic monolayers may be grown over the monoatomic layer, thereby forming a surface coating having greater thicknesses.

The ALD process can be illustrated by the formation of aluminum oxide ($Al_2O_3$) coatings on a silicon-based electrode material as in the illustrative process shown in FIG. 3. An electrode precursor material 150 comprising silicon has a surface that may be first pretreated with oxygen plasma or peroxide ($H_2O_2$) to form a plurality of hydroxyl groups (OH) on the surface. While not shown, the reactor may have another reaction chamber for conducting the plasma or peroxide pretreatment. The presence of the hydroxide groups on surfaces of the electrode material substrate provides suitable reactive species for the deposition of aluminum-containing species on preselected regions of the surface. The hydroxide groups may be protected in an argon atmosphere and excess plasma or peroxide may be removed by a flow of argon gas. The electrode precursor material 150 may be disposed in a suitable first reaction chamber 142 to conduct a step-wise conformal coating process.

Precursors and accompanying gases may be introduced into the second zone 158, such as argon. A predetermined amount of aluminum, in the form of a suitable volatile precursor compound, such as trimethyl aluminum (TMA (($CH_3)_3Al$)), is introduced as a vapor (for example at a temperature of about 50° C.) and flows into contact with the exposed surfaces of the electrode precursor material 150. Preferably, a stoichiometric excess of TMA to hydroxyl or reactive groups on the surface is provided. The TMA chemisorbs to the oxygen/hydroxyl groups on the surface of the electrode precursor material 150. Methane ($CH_4$) is released as a byproduct. Typically, reaction of the aluminum-containing material with the surface groups of electrode precursor material 150 is completed in a short time frame, on the order of a few seconds, for example.

Next, in the first zone, water vapor ($H_2O$) or oxygen ($O_2$) is introduced to flow over the exposed surface of the electrode precursor material 150. The water ($H_2O$) further reacts with the TMA and forms methane ($CH_4$). As such, a first conformal layer of aluminum oxide ($Al_2O_3$) forms on the surface of the electrode precursor material 150. Excess reactants and byproducts may be removed from the first reaction chamber 142 (not shown in FIG. 3). In the next second reaction zone 158, TMA is introduced again followed by exposure to water or oxygen in the next first reaction zone 156 to form another layer of aluminum oxide. The ALD process is repeated in each deposition region 160 to grow an $Al_2O_3$ film layer by layer on the surface of the electrode precursor material 150. As generally shown, five atomic monolayers of $Al_2O_3$ are formed due to the presence of five deposition regions 160.

The ALD process is illustrative of one technique for forming aluminum oxide ($Al_2O_3$) coatings on a silicon-based electrode material, but the process may also be used to form other coatings as well, by way of non-limiting example. For example, other oxide-based, nitride-based, or fluoride-based coatings may be formed on the graphite-based electrode materials via an ALD process. In certain aspects, the oxide-based coating may be selected from aluminum oxide ($Al_2O_3$), titanium oxide ($TiO_2$), silicon oxide ($SiO_2$), vanadium oxide ($VnO_5$), zirconium oxide ($ZrO_2$), or zinc oxide (ZnO). For a titanium oxide coating ($TiO_2$), the precursor materials may be tetrakis(diethylamido)titanium(IV), tetrakis(dimethylamido)titanium(IV), and/or titanium(IV) isopropoxide, by way of example. For a vanadium oxide coating ($V_2O_5$), the metal precursor can be vanadium(V) oxytriisopropoxide, for example. For a zirconium oxide coating ($ZrO_2$), the precursors may be zirconium tetrachloride ($ZrCl_4$) and oxygen ($O_2$). For a zinc oxide coating (ZnO), the precursor material may be methyl zinc isopropoxide. For a silicon oxide coating, the precursor materials can be silicon tetrachloride, tetraethyl orthosilicate, and/or tris(tert-butoxy)silanol, by way of example. For a fluoride-based coating, suitable precursor materials can be lithium fluoride (LiF), aluminum fluoride ($AlF_3$), and the like. For a nitride-based coating, suitable precursor materials can be ammonia ($NH_3$), ammonium hydroxide ($NH_4OH$), titanium nitride (TiN), vanadium nitride (VN), aluminum nitride ((AlN) where the precursor is TMA and ammonia), and tungsten hexafluoride ($WF_6$), silicon tetrachloride ($SiCl_4$), or dichlorosilane ($SiH_2Cl_2$) combined with ammonia ($NH_3$), and the like.

In certain variations, the applying of the surface coating can be conducted by an atomic layer deposition (ALD) process with a precursor selected from the group consisting of: trimethyl aluminum (TMA (($CH_3)_3Al$)), tetrakis(diethylamido)titanium(IV), tetrakis(dimethylamido)titanium (IV), titanium(IV) isopropoxide, vanadium(V) oxytriisopropoxide, silicon tetrachloride, tetraethyl orthosilicate, tris (tert-butoxy)silanol, lithium fluoride (LiF), aluminum fluoride ($AlF_3$), ammonia ($NH_3$), ammonium hydroxide ($NH_4OH$), titanium nitride (TiN), vanadium nitride (VN), aluminum nitride ((AlN) where the precursor is TMA and ammonia), tungsten hexafluoride ($WF_6$) and ammonia ($NH_3$), silicon tetrachloride ($SiCl_4$) and ammonia ($NH_3$), or dichlorosilane ($SiH_2Cl_2$) combined with ammonia ($NH_3$), lithium fluoride (LiF), aluminum fluoride ($AlF_3$), and the like. Moreover, in alternative variations, $Al_2O_3$ or other coatings can be easily obtained by using different precursors and deposition processes.

After the protective first coating 162 is applied in the first reaction chamber 142, the electrode precursor material 150 exits the first reaction chamber 142 and then enters the second reaction chamber 144. In the second reaction chamber 144, the electrode precursor material 150 is lithiated. For example, lithiation may occur by a thermal evaporation process. In a thermal evaporation process, a vacuum pump (not shown) may be used to maintain a pressure in the second reaction chamber 144. Thermal evaporation uses an increase in vapor pressure with temperature of a material to evaporate a source of material, then condenses a layer on a substrate (here electrode precursor material 150), which is typically substantially cooler than a source 166 material. For example, in a thermal evaporation process, the metal can be placed in a crucible under the vacuum (e.g., $<10^{-3}$ Torr), and liquid metal can be heated up (>50° C. higher than its melting point) at which point, it becomes a vapor, which would be deposited on a solid electroactive material or electrode surface. Where a thermal evaporation process is used, a thickness of the applied layer may be greater than or equal to about 1 micrometer (μm) less than or equal to about 50 μm, optionally greater than or equal to about 2 μm less than or equal to about 20 μm, in certain variations, optionally greater than or equal to about 3 nm less than or equal to about 10 μm of the lithium metal.

In certain aspects, lithiation of silicon by direct reaction can be expressed by: $4.4xLi + Si \rightarrow Li_{4.4x}Si$, where $0 \le x \le 1$, while for electrochemical lithiation of silicon, it can be expressed as $4.4xLi^+ + 4.4xe^- + Si \rightarrow Li_{4.4x}Si$. In certain variations, the electroactive materials that are pre-lithiated in accordance with certain aspects of the present disclosure may form a surface layer comprising lithium silicon alloys represented by $Li_{4.4x}Si$, where $0 \le x \le about\ 0.85$.

Thus, a heater 164 is disposed below a source 166 of lithium metal for heating it. As the temperature of the lithium metal in the source 166 rises, lithium metal evaporates or volatilizes and lithium molecules 168 are directed towards the electrode precursor material 150. A second coating 170 of the lithium metal or a lithium-containing coating is thus formed over the protective first coating 162 and the electrode precursor material 150. After the first and second coatings 162, 170 are applied to the electrode precursor material 150, the electrode precursor material 150 is spooled onto the second roll 154 and can be removed from the reactor 140. Thus, a continuous process may be conducted in the single reactor 140, where there is no need to pump down the chambers and adjust temperature and pressure conditions during processing. Thus, the pressure in the first and second reaction chambers 142, 144 can be maintained at steady state levels for the respective deposition processes. As will be appreciated by those of skill in the art, different designs for continuous ALD processes can be integrated with thermal evaporation to provide concurrent deposition of the protective coating and lithiation of electrode materials, such as silicon-containing electrode precursor materials.

Notably, the application of the protective first coating 162 followed by the lithiation process has the advantage of diminishing any potential physical damage that may occur due to volumetric expansion of the electrode precursor during the initial lithiation process. Further, the protective first coating 162 being present prior to lithiation assists in reducing surface roughness increases that might otherwise occur for a silicon-containing electrode precursor during the initial lithiation process.

In one example, the deposition temperature for $Al_2O_3$ coating is about 200° C. Trimethyl-aluminum is used as the aluminum (Al) precursor and $H_2O$ as the oxygen (O) precursor. Both precursors are heated to about 80° C. during the deposition process. The exposure time and pump down time for each precursor is about 10 seconds and 20 seconds respectively.

Figure 4:
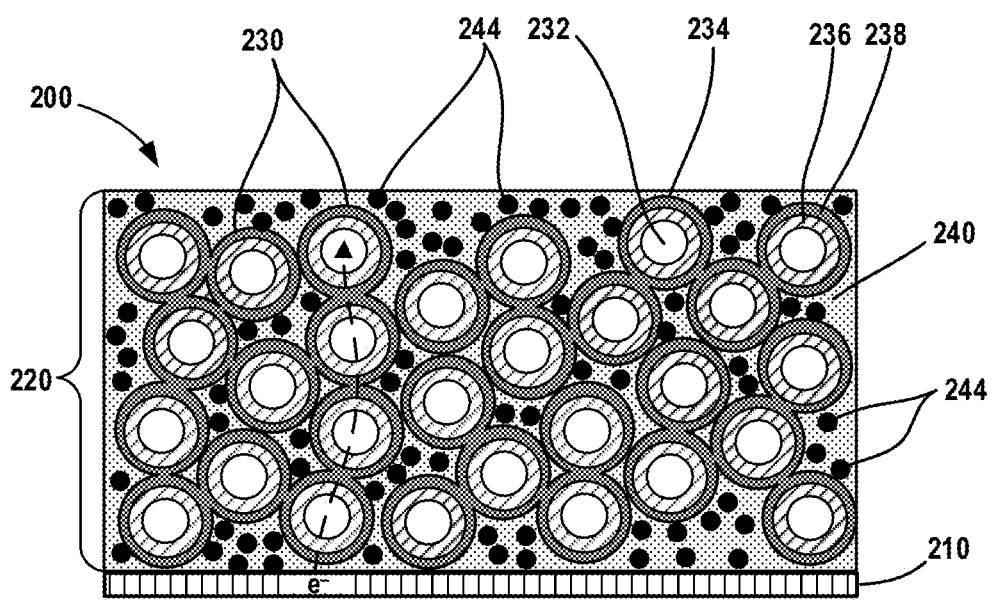
FIG. 4 shows an illustration of a cross-sectional view of a negative electrode incorporating a plurality of negative electroactive material particles having a multilayer coating (including a lithium-containing coating and an ALD protective coating) prepared in accordance with certain aspects of the present disclosure.

FIG. 4 shows a prefabricated electrode having been subjected to a process according to certain aspects of the present disclosure like that described in the context of FIG. 3. A negative electrode 200 includes a current collector 210 and an active layer 220. A plurality of negative electroactive particles 230 include a core region 232 and a multilayer coating 234 that includes a protective first coating 236 and a second lithium-containing (e.g., lithiated) layer 238. The plurality of negative electroactive particles 230 are distributed within a porous matrix 240 (pores not shown). The porous matrix 240 may be formed of one or more polymeric binders. The active layer also includes a plurality of electrically conductive particles 244 distributed within the porous matrix 240.

In this embodiment, the binder may be a conventional binder like those described in the context of the positive electrode 24. Suitable binders include polyvinylidene difluoride (PVdF), polytetrafluoroethylene (PTFE), ethylene propylene diene monomer (EPDM) rubber, or carboxymethyl cellulose (CMC), a nitrile butadiene rubber (NBR), styrene-butadiene rubber (SBR), lithium polyacrylate (LiPAA), sodium polyacrylate (NaPAA), sodium alginate, lithium alginate and the like. The plurality of electrically conductive particles 244 may include carbon-based materials, powdered nickel or other conductive metal particles, or a conductive polymer. Carbon-based materials may include, for example, particles of graphite, acetylene black (such as KETCHEN™ black or DENKA™ black), carbon fibers and nanotubes, graphene, and the like. Examples of a conductive polymer include polyaniline, polythiophene, polyacetylene, polypyrrole, and the like. In certain aspects, mixtures of such conductive materials may be used.

The negative electrode 200 may include greater than or equal to about 50 weight % to less than or equal to about 90 weight %, and in certain aspects, optionally from greater than or equal to about 60 weight % to less than or equal to about 80 weight % of the plurality of negative electroactive particles 230. The negative electrode 200 may include greater than or equal to about 1 weight % to less than or equal to about 40 weight %, and in certain aspects, optionally from greater than or equal to about 10 weight % to less than or equal to about 35 weight % of the more polymeric binders that form the polymeric matrix. The negative electrode 200 may include greater than or equal to about 0.5 weight % to less than or equal to about 25 weight %, and in certain aspects, optionally from greater than or equal to about 10 weight % to less than or equal to about 15 weight % of the plurality of electrically conductive particles 244.

A negative electrode 200 may be made by mixing the negative electroactive material, such as silicon-containing particles, into a slurry with a polymeric binder compound, a non-aqueous solvent, optionally a plasticizer, and optionally if necessary, electrically conductive particles. The slurry can be mixed or agitated, and then thinly applied to a substrate via a doctor blade. The substrate can be a removable substrate or alternatively a functional substrate, such as a current collector (such as a metallic grid or mesh layer) attached to one side of the electrode film. In one variation, heat or radiation can be applied to evaporate the solvent from the electrode film, leaving a solid residue. The electrode film may be further consolidated, where heat and pressure are applied to the film to sinter and calendar it. In other variations, the film may be air-dried at moderate temperature to form self-supporting films. If the substrate is removable, then it is removed from the electrode film that is then further laminated to a current collector. With either type of substrate it may be necessary to extract or remove the remaining plasticizer prior to incorporation into the battery cell.

Figure 5A:
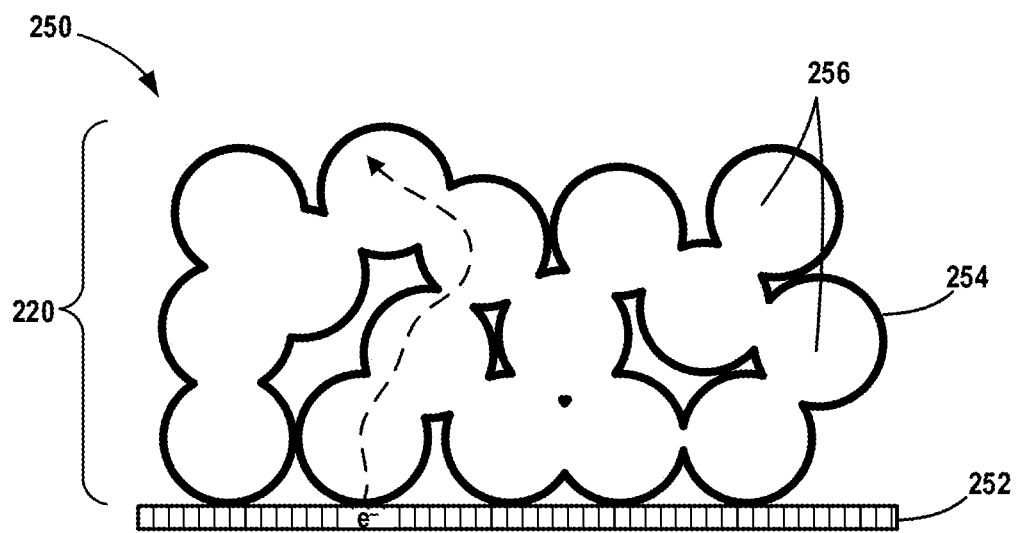
FIG. 5A shows an illustration of a cross-sectional view of a negative electrode incorporating a plurality of negative electroactive material particles having a multilayer coating, where the ALD protective coating is applied to a prefabricated electrode formed in accordance with certain aspects of the present disclosure.

FIG. 5A shows a prefabricated electrode 250 on a current collector 252 having been subjected to a process according to certain aspects of the present disclosure like that described in the context of FIG. 3. Notably, a simplified version of the prefabricated electrode is shown where the porous polymeric matrix and electrically conductive particles are omitted. The prefabricated electrode 250 is subjected to a continuous process where it was concurrently lithiated and coated with a protective coating. Thus, a coating 254 is applied over the prefabricated electrode including a plurality of electroactive particles 256. As the coating 254 is applied after the electroactive particles 256 are assembled in the prefabricated electrode 250, electrons often have a direct pathway between respective electroactive particles 256 and therefore, a lower impedance and internal resistance in the prefabricated electrode 250.

Figure 5B:
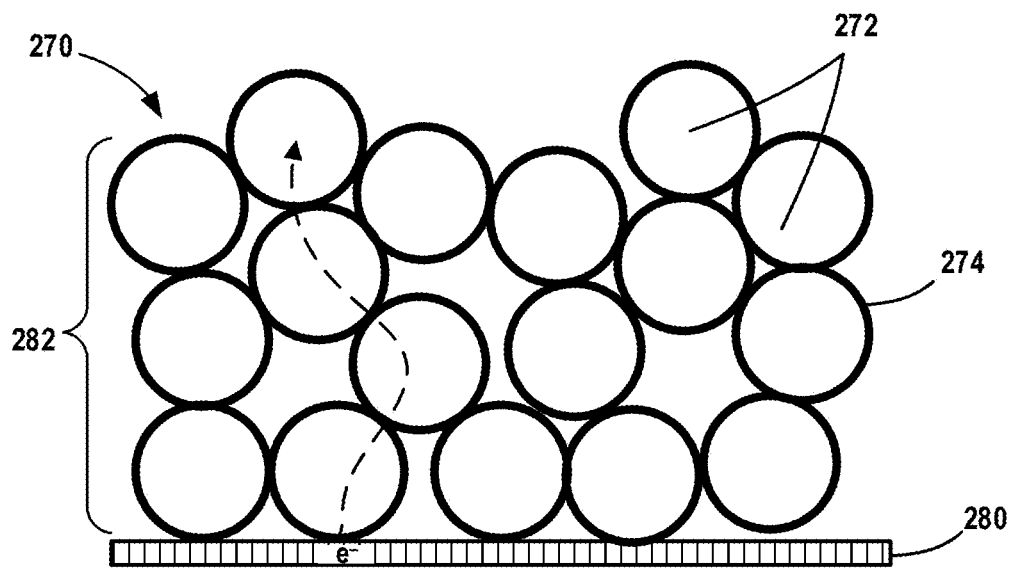
FIG. 5B shows an illustration of a cross-sectional view of a negative electrode incorporating a plurality of negative electroactive material particles having a multilayer coating (including a lithium-containing coating and an ALD protective coating) applied to electroactive particles that are then formed into an electrode in accordance with certain aspects of the present disclosure.

FIG. 5B on the other hand, shows an electrode 270 that is made by first treating negative electroactive material particles, such as treated silicon-containing particles 272 having a lithium-containing coating and protective coating 274 applied, followed by a formation process to create the electrode 270. Thus, in the process described in the context of FIG. 3, the electrode precursor material may be a plurality of particles (e.g., powder) that are treated in the continuous process in the single reactor. After the treated silicon-containing particles 272 having a lithiated and protective coating 274 are formed, they may be made into the electrode 270 by casting them in a slurry with a polymeric binder compound, a non-aqueous solvent, optionally a plasticizer, and optionally if necessary, electrically conductive particles. The slurry is cast onto a current collector 280. Due to the coating 274 being applied to the electroactive materials prior to formation of the electrode 270, electrons that travel from the current collector 280 into an active layer 282 of the electrode 270 encounter the coating 274 between respective electroactive particles 272. Therefore, electrode 270 may have a slightly higher internal resistance, as compared to the variation shown in FIG. 5A.

It should be noted that the present disclosure also contemplates various permutations of coating the individual electroactive material particles with an ALD coating and prelithiating the materials. For example, the individual particles of the electroactive material may be coated with an ALD coating, the electroactive particles having the ALD protective coating may be fabricated as electrodes (e.g., fabricated as electrode rolls in a conventional roll-to-roll process) and then lithiated as electrodes as part of the production line or separately.

A battery may thus be assembled in a laminated cell structure, comprising an anode layer (in the form of the negative electrode like 250 in FIG. 5A or 270 in FIG. 5B), a cathode layer, and electrolyte/separator between the anode and cathode layers. The anode and cathode layers each comprise a current collector. A negative anode current collector may be a copper collector foil, which may be in the form of an open mesh grid or a thin film. The current collector can be connected to an external current collector tab.

For example, in certain variations, an electrode membrane, such as an anode membrane, comprises the electrode active material (e.g., coated lithiated-silicon containing particles) dispersed in a polymeric binder matrix over a current collector. The separator can then be positioned over the negative electrode element, which is covered with a positive electrode membrane comprising a composition of a finely divided lithium insertion compound in a polymeric binder matrix. A positive current collector, such as aluminum collector foil or grid completes the assembly. Tabs of the current collector elements form respective terminals for the battery. A protective bagging material covers the cell and prevents infiltration of air and moisture. Into this bag, a liquid electrolyte may be injected into the separator (and may be imbibed into the positive and/or negative electrodes) suitable for lithium ion transport. In certain aspects, the laminated battery is further hermetically sealed prior to use.

The protective surface coating (such as an oxide-based coating) applied to a negative electroactive material comprising a lithiated silicon-containing electroactive material in accordance with certain aspects of the present technology may be formed over the entire exposed surface and thus serve as an artificial solid electrolyte interface layer, which can protect the electrode from reaction with liquid electrolyte. In various aspects, the electroactive materials comprising lithium-silicon alloys may have a surface coating providing certain advantages, such as high cut voltage (e.g., cut-off potentials relative to a lithium metal reference potential) that desirably minimizes or avoids SEI formation. In certain aspects, a lithium-ion battery incorporating an inventive negative electroactive material having a lithiated silicon-containing electroactive material with a protective coating substantially maintains charge capacity (e.g., performs within a preselected range or other targeted high capacity use) for at least about 1,000 hours of battery operation, optionally greater than or equal to about 1,500 hours of battery operation, optionally greater than or equal to about 2,500 hours or longer of battery operation, and in certain aspects, optionally greater than or equal to about 5,000 hours or longer (active cycling).

In certain aspects, the lithium-ion battery incorporating a negative electroactive/electrode material having a lithiated silicon-containing electroactive material with a protective coating prepared in accordance with certain methods of the present disclosure maintains charge capacity and thus is capable of operating within 20% of target charge capacity for a duration of greater than or equal to about 2 years (including storage at ambient conditions and active cycling time), optionally greater than or equal to about 3 years, optionally greater than or equal to about 4 years, optionally greater than or equal to about 5 years, optionally greater than or equal to about 6 years, optionally greater than or equal to about 7 years, optionally greater than or equal to about 8 years, optionally greater than or equal to about 9 years, and in certain aspects, optionally greater than or equal to about 10 years.

In other aspects, the lithium-ion battery incorporating a lithiated silicon-containing electroactive material with a protective coating prepared in accordance with certain methods of the present disclosure is capable of operating at less than or equal to about 30% change in a preselected target charge capacity (thus having a minimal charge capacity fade), optionally at less than or equal to about 20%, optionally at less than or equal to about 15%, optionally at less than or equal to about 10%, and in certain variations optionally at less than or equal to about 5% change in charge capacity for a duration of at least about 100 deep discharge cycles, optionally at least about 200 deep discharge cycles, optionally at least about 500 deep discharge cycles, optionally at least about 1,000 deep discharge cycles.

Stated in another way, in certain aspects, a lithium-ion battery or electrochemical cell incorporating an electrode with a lithiated silicon-containing electroactive material having a protective coating prepared in accordance with certain methods of the present disclosure substantially maintains charge capacity and is capable of operation for at least about 1,000 deep discharge cycles, optionally greater than or equal to about 2,000 deep discharge cycles, optionally greater than or equal to about 3,000 deep discharge cycles, optionally greater than or equal to about 4,000 deep discharge cycles, and in certain variations, optionally greater than or equal to about 5,000 deep discharge cycles.

Figure 6:
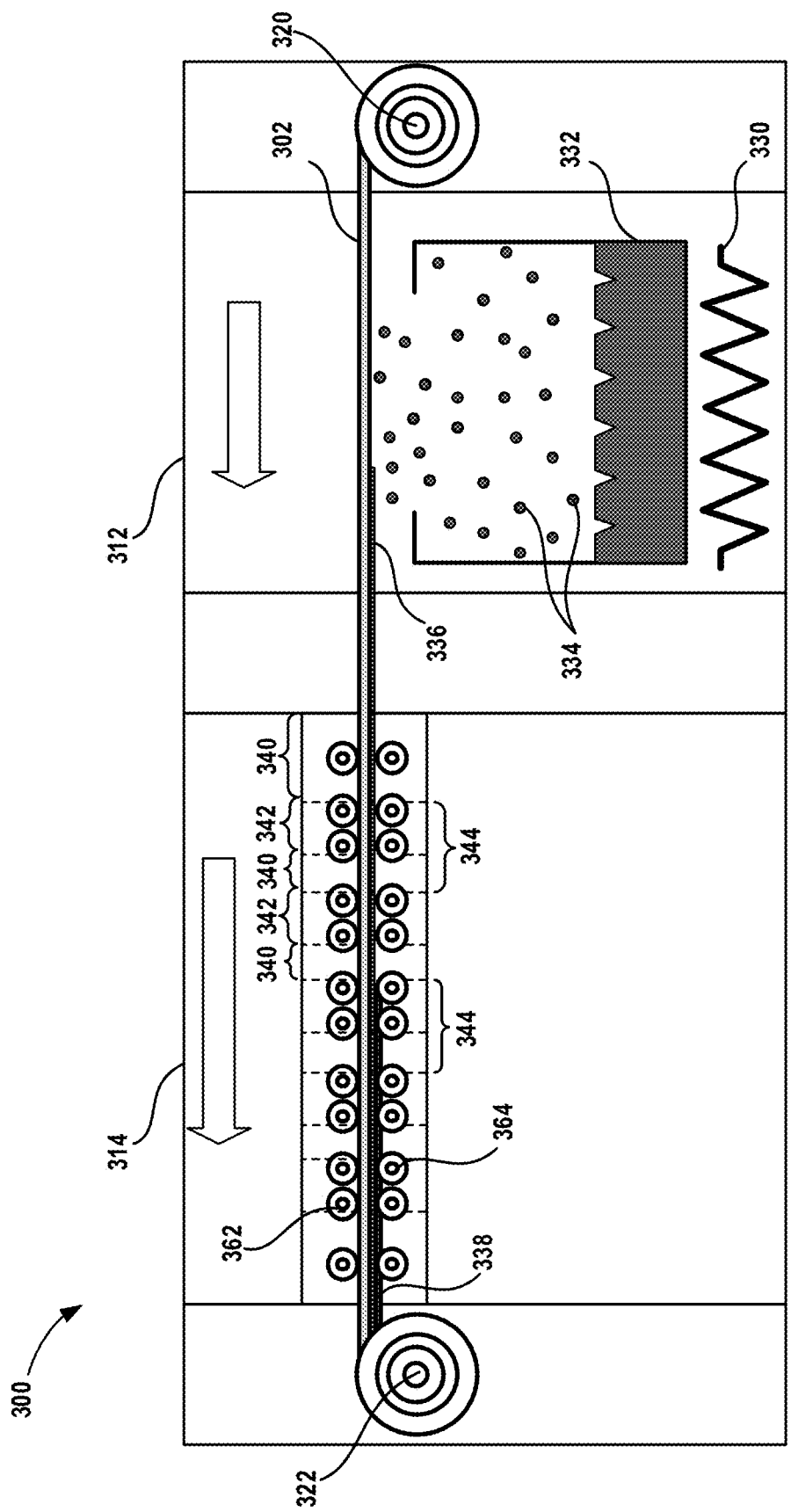
FIG. 6 is an illustration of a reaction chamber for conducting a continuous process for forming a negative electroactive material particle having a multilayer coating including a first reaction chamber to apply a lithium-containing coating via thermal evaporation and a connected second reaction chamber to apply an ALD protective coating in accordance with certain aspects of the present disclosure.

FIG. 6 shows another variation of a single reactor 300 in which a method of making an electrode material, such as a negative electrode material, for an electrochemical cell that cycles lithium ions in accordance with certain aspects of the present can be conducted. The method is similar to that described in the context of FIG. 3; however, the process of lithiation and applying of the protective coating on an electrode precursor material 302 are reversed. Thus, for brevity, common aspects of the methods and reactor will not be described herein again. The reactor 300 includes a first reaction chamber 312 and a second reaction chamber 314 that permit a material, namely the electrode precursor material 302, to pass therebetween (e.g., via a conveyor or roll-to-roll process). In particular, an electrode precursor material 302 is unrolled from a first reel or roll 320, is introduced into the reactor 300, is transported through the first and second reaction chambers 312, 314 to a second roll 322, where it is spooled again. As discussed in the context of FIG. 3, the electrode material precursor 302 may be in a variety of different forms, while not shown, including a plurality of electroactive material particles conveyed on a belt that may be distributed onto the conveyer and collected after treatment in the reactor 300.

In the first reaction chamber 312, the electrode precursor material 302 is lithiated. For example, lithiation may occur by a thermal evaporation process. In a thermal evaporation process, a vacuum pump (not shown) may be used to maintain a pressure in the first reaction chamber 312. A heater 330 is disposed below a source 332 of lithium metal for heating it. As the temperature of the lithium metal in the source 332 rises, lithium metal evaporates or volatilizes and molecules 334 are directed towards the electrode precursor material 302. A first coating 336 of the lithium metal is thus formed over a surface of the electrode precursor material 302.

After the lithium-containing first coating 336 is applied in the first reaction chamber 312, the electrode precursor material 302 exits the first reaction chamber 312 and then enters the second reaction chamber 314. In the second reaction chamber 314, a second protective coating 338 is applied over the first coating 336. The second protective coating 338 may be selected from the group consisting of: an oxide-based coating, such as aluminum oxide ($Al_2O_3$), a fluoride-based coating, and a nitride-based coating. In certain variations, the applying of the surface coating can be conducted by an atomic layer deposition (ALD), as described previously above.

The second reaction chamber 314 includes first zones 340 and second zones 342 that are arranged in an alternating fashion in the second reaction chamber 314. A gas or vapor comprising an oxidant, such as oxygen or water, is introduced into each of the first zones 340. One or more ALD precursors is introduced into each of the second zones 342. Each first zone 340 and second zone 342 together define one deposition region 344. As the electrode precursor material 302 passes through one first zone 340 and then one second zone 342 in one deposition region 344, the second protective coating 338 is applied over the first lithiation layer 336 on the electrode precursor material 302. As will be appreciated by those of skill in the art, the number of deposition regions 344 having alternating first and second zones 340, 342 determines a thickness of the coating deposited, where a greater number of deposition regions results in a thicker second coating 338. As discussed previously, 5 deposition regions 344 are shown that correspond to 5 deposition cycles capable of providing the second protective coating 338 with a desired thickness in the ranges discussed above.

A second protective coating 338 is thus formed over the first coating 336 of lithium metal over the electrode precursor material 302. After the first and second coatings 336, 338 are applied to the electrode precursor material 302, the electrode precursor material 302 is spooled onto the second roll 322 and can be removed from the reactor 300. Thus, a continuous process may be conducted in the single reactor 300, where there is no need to pump down the chambers and adjust temperature and pressure conditions during processing. Thus, the pressure in the first and second reaction chambers 312, 314 can be maintained at steady state levels for the respective deposition processes, resulting an efficient process.

Thus, in various aspects, the present disclosure contemplates a method of making robust, lithiated silicon electroactive materials in a continuous process in a single reactor. In certain aspects, a continuous process is used to create an ALD coating on a silicon-containing electrode precursor, where lithium is subsequently evaporated onto the silicon-containing electrode precursor to prelithiate the electrode. Prelithiation is especially important for electroactive materials used in lithium ion battery chemistries that are associated with large first cycle capacity loss, which as discussed above may include silicon-containing electroactive materials like silicon oxides (SiOx) or elemental silicon electrodes, by way of non-limiting example.

In various aspects, the methods enable subsequent processing of an electrode precursor without exposing the electrode/electrode precursor to the external atmosphere, which saves time in avoiding pumping down the reactors, while improving the quality of electrode. In certain aspects, the design of the ALD process can create a relatively thick coating (e.g., ≥1 nm) on electrodes by either increasing the electrode precursor path length in ALD reaction chamber or enabling multiples passes of the electrode through ALD reaction chamber. An amount of Li prelithiation is combined with appropriate negative electrode capacity/positive electrode capacity ratio (N/P ratio) to control silicon electrochemical potential within an appropriate window to improve the cycle stability of the battery. For example, prelithiation can drive silicon potential down, depending on N/P ratio and amount of Li that is prelithiated. When the present methods are employed to form an electroactive material/electrode, the protective ALD coating can mitigate mechanical degradation of SEI/silicon containing electroactive materials by enhancing the mechanical integrity at electrode level, suppressing electrolyte decomposition, and facilitating charge transfer. Furthermore, the ALD protective coating can better passivate electrode after prelithiation.

Figure 7:
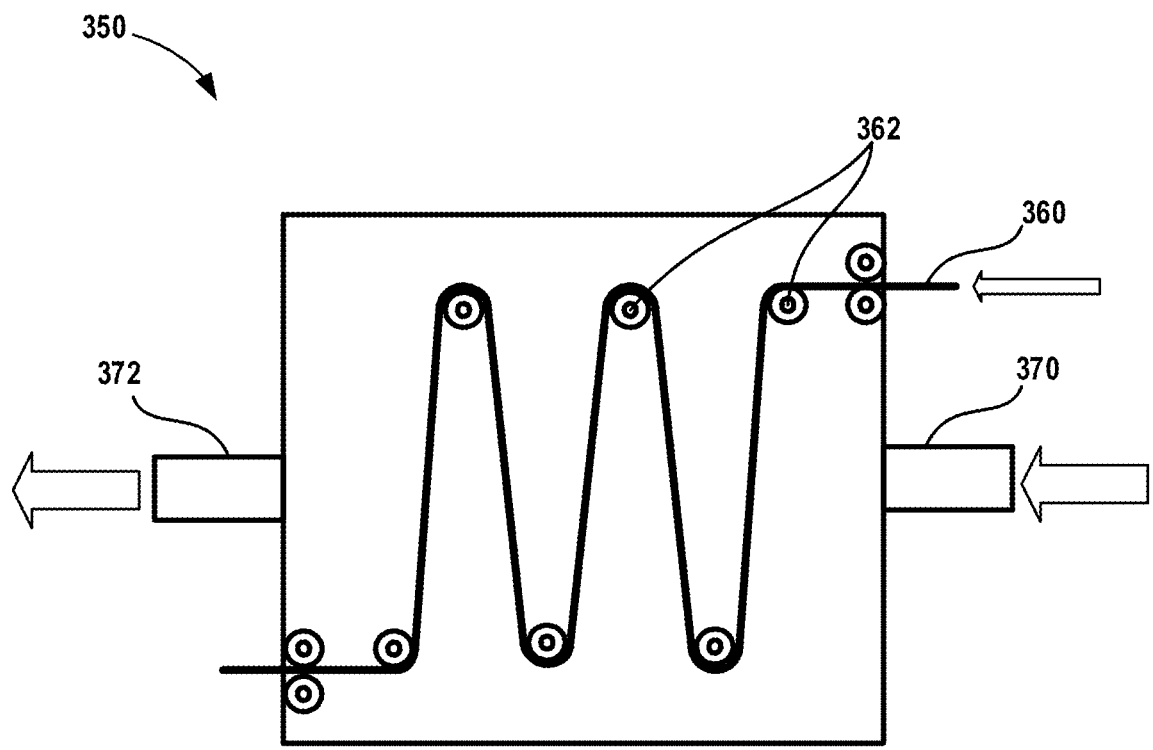
FIG. 7 shows an alternative variation of a reaction chamber for conducting a continuous ALD process.

In one alternative variation, the reaction chamber for conducting ALD in the reactor 140 in FIG. 3 or reactor 300 in FIG. 6 (namely the first reaction chamber 142 in reactor 140 or second reaction chamber 314 in reactor 300) may instead have a design like that shown in FIG. 7. An ALD reaction chamber 350 that continuously processes an electrode precursor material 360 is contemplated herein. The ALD reaction chamber 350 has a relatively long path length for the electrode precursor material 360 in that it alternately passes between a plurality of upper rolls 362 and a plurality of lower rolls 364. The precursors for the ALD process are fed into an inlet 370 and can be pumped out of an outlet 372. As the path length for the electrode precursor material 360 inside the ALD reaction chamber 350 is longer, multiple deposition cycles can be conducted (by alternating introduction of ALD precursors and oxidants, like oxygen or water, into the inlet 370) while the electrode precursor material 360 remains inside to apply multiple layers of the ALD coating to the electrode precursor material 360. As will be appreciated by those of skill in the art, the path length inside the ALD reaction chamber 350 may be predetermined in view of the length of each deposition cycle (and how many are required to achieve a predetermined coating thickness) and speed at which the electrode precursor material 360 travels inside the ALD reaction chamber 350. In this manner, the ALD reaction chamber 350 in FIG. 7 may be integrated into a continuous production line (in combination with an upstream or downstream reaction chamber for thermal evaporation of lithium).

In another alternative embodiment, the reactor 140 in FIG. 3 or reactor 300 in FIG. 6 may instead by a reactor 400 like that in FIG. 8. In this reactor 400, there is only a single reaction chamber, which may be conducted separately from a continuous production line. The reactor 400 has an inlet 402 and an outlet 404. An electrode precursor material 410 is conveyed within the reactor 400 by rollers 412. However, the processing may be a stop-start batch type processing, as will be described herein. In one variation, an ALD process may be first conducted on a region of the electrode precursor material 410 inside the reactor 400. Multiple ALD deposition cycles can be conducted while the electrode precursor material 410 is inside the reactor 400, by alternating introduction of ALD precursors and oxidants, like oxygen or water, into the inlet 402. The excess reactant and byproduct gases may be intermittently evacuated through the outlet 404 to reactor 400 for multiple ALD deposition cycles while the electrode precursor material 410 remains inside. In this manner, multiple layers of the ALD coating can be applied to the electrode precursor material 410 to form a predetermined coating thickness. After evacuating the chamber in the reactor 400 of all ALD reactants, thermal evaporation of lithium can be conducted.

A heater 420 is disposed below a source 422 of lithium metal. When the heater 420 is activated, the temperature of the lithium metal in the source 422 rises, so that volatilized lithium molecules 424 are directed towards the electrode precursor material 410. A second lithium-containing coating is thus formed over the first ALD coating on the electrode precursor material 410. After the first protective ALD coating and second lithium-containing coating are applied to the electrode precursor material 410, the electrode precursor material 410 can be removed from the reactor 400. As will be appreciated by those of skill in the art, the application of the ALD coating and lithium-containing coatings may be reversed, so that the thermal evaporation of lithium occurs first, followed by an ALD deposition process described above.

In certain aspects, the present disclosure provides methods of prelithiating an electrode material that provides appropriate lithium levels for a balanced cell. An electrochemical cell, for example battery 20 illustrated in FIG. 1 can be cycled to determine the amount of lithiation required. At the start of a first charge, the positive electrode may be fully lithiated. For example, the initial concentration of lithium at the positive electrode ($Q_{po}$) may be represented by:

$$Q_{po} = m_p q_{po}$$

where $m_p$ is the mass (g/cm$^2$) of the positive electroactive materials and $q_{po}$ is initial specific capacity (mAh/g) of the positive electroactive materials. During the first charge, all of the lithium moves out of the positive electrode. However, only a part of the displaced lithium intercalates into or alloys with the negative electrode because of, for example, the formation of a solid electrolyte interphase (SEI) layer and other electrolyte reactions. The concentration (mAh/cm$^2$) of lithium at the negative electrode ($Q_n$) may be represented by:

$$Q_n = m_n q_n$$

where $m_n$ is the mass (g/cm²) of the negative electroactive materials and $q_n$ is initial specific capacity (mAh/g) of the negative electroactive materials. The first cycle or irreversible capacity loss (IRCL) may be represented by:

$$IRCL = m_n q_n (1 - \eta_n)$$

where ($\eta_n$) is the first-cycle efficiency of the negative electrode.

In various aspects, as highlighted above, lithiation of the negative electrode may compensate for such first cycle capacity losses. $Q_{PLi}$ represents the amount (mAh/cm²) of lithiated lithium, while $\eta_{PLi}$ represents a degree of lithiation. For example, $\eta_{PLi}$ may be defined by:

$$\eta_{PLi} = \frac{Q_{PLi}}{IRCL} = \frac{Q_{PLi}}{m_n q_n (1 - \eta_n)}$$

The cyclable lithium ($Q_{Li}$), including lithium intercalated into the negative electrode at the end of the first charge, may be represented as:

$$Q_{Li} = m_p q_{po} - m_n q_n (1 - \eta_n) + \eta_{PLi} m_n q_n (1 - \eta_n) =$$
$$m_p q_{po} - m_n q_n (1 - \eta_n)(1 - \eta_{PLi}) = m_p q_{po}[1 - NP_1(1 - \eta_n)(1 - \eta_{PLi})]$$

where $NP_1$ is the N-to-P ratio based on the first cycle capacities, for example as represented by:

$$NP_1 = \frac{m_n q_n}{m_p q_{po}}$$

In this fashion, the cyclable lithium ($Q_{Li}$) may be generally detailed as the difference between the concentration of lithium at the positive electrode ($Q_{po}$) and the first cycle or irreversible capacity loss (IRCL) together with the lithiated lithium ($Q_{PLi}$). The maximum possible lithiation of the negative electrode ($x_{max}$) may be represented by:

$$x_{max} = \frac{Q_{Li}}{m_n q_n} = \frac{m_p q_{po} - m_n q_n (1 - \eta_n)(1 - \eta_{PLi})}{m_n q_n} = \frac{1}{NP_1} - (1 - \eta_n)(1 - \eta_{PLi})$$

Following the first discharge, as a result of the first cycle capacity loss, active sites of the positive electrode are lost. For example, the first cycle efficiency of the positive electrode ($\eta_p$) may be represented by:

$$\eta_p = \frac{q_{pr}}{q_{po}}$$

where $q_{pr}$ is the reversible specific capacity of the positive electrode and $q_{po}$ is initial specific capacity of the positive electroactive materials as noted above.

The reversible capacity ($Q_{pr}$) of the positive electrode may be represented by:

$$Q_{pr} = m_p q_{pr} = \eta_p m_p q_{po}$$

when the positive electrode has sufficient capacity for cyclable lithium, $Q_{pr} \geq Q_{Li}$. The negative electrode maintains substantially the same number of active sites. The reversible capacity of the negative electrode is the same as the initial capacity of the negative electrode. As such, the reversible capacity of the electrochemical cell ($Q_r$) may be represented by:

$$Q_r = Q_{Li} = Z m_p q_{pr}$$
$$\text{where } Z = \frac{1 - NP_1(1 - \eta_n)(1 - \eta_{PLi})}{\eta_p}.$$

In such instances, the maximum lithium occupancy at the positive electrode ($y_{max}$) may be represented as $$y_{max} = \frac{Q_{Li}}{Q_{pr}} = Z$$

If the positive electrode does not have sufficient capacity for cyclable lithium ($Q_{pr} < Q_{Li}$ and $Z > 1$), the reversible cell capacity may be represented by:

$$Q_r = Q_{pr} = \eta_p m_p q_{po}$$

and the maximum lithium occupancy at the positive electrode may be 1 ($y_{max}=1$). In such instances, the residual lithium may be represented by $$\Delta Q = Q_{Li} - Q_{pr} = m_p q_{po}[1 - NP_1(1 - \eta_n)(1 - \eta_{PLi})] - \eta_p m_p q_{po} =$$
$$m_p q_{po}[1 - NP_1(1 - \eta_n)(1 - \eta_{PLi}) - \eta_p]$$

The residual lithium cannot be deintercalated or dealloyed from the negative electrode, as such the minimum lithium occupancy ($x_{min}$) may be represented by:

$$x_{min} = \frac{\Delta Q}{Q_n} = \frac{m_p q_{po}[1 - NP_1(1 - \eta_n)(1 - \eta_{PLi}) - \eta_p]}{m_n q_n}$$

or $$x_{max} = \frac{1}{NP_1} - (1 - \eta_n)(1 - \eta_{PLi}) = \frac{1}{NP_r}\left[\frac{1}{\eta_p} - NP_r(1 - \eta_n)(1 - \eta_{PLi})\right]$$

Considering charge, Q is the amount of lithium moved out of positive electrode, such that $$m_p q_{pr} y = m_p q_{pr} y_i - Q$$

and $$m_n q_n x = m_n q_n x_i + Q$$

From which it can be determined that:

$$x = x_i + \frac{1}{NP_r}(y_i - y)$$

and $$y = y_i - NP_r(x - x_i)$$

At the start of discharge:

$$x_i = x_{max} = \frac{Z}{NP_r}$$

and $$y_i = y_{min} = 0$$

such that $$y = NP_r\left[\frac{Z}{NP_r} - x\right] = Z - NP_r x$$

The following summarizes the detailed processes for determining appropriate lithium levels for a balanced cell:

| Z | $\left[\frac{1}{\eta_p} - NP_r(1-\eta_n)(1-\eta_{PLi})\right]$ | |
|---|---|---|
| | or | |
| | $\left[\frac{1}{\eta_p} - \frac{NP_1}{\eta_p}(1-\eta_n)(1-\eta_{PLi})\right]$ | |
| Z | ≤1 (negative limited, enough capacity at the positive) | >1 (positive limited) |
| $x_{min}$ | 0 | $\frac{Z-1}{NP_r}$ |
| $x_{max}$ | $\frac{Z}{NP_r}$ | $\frac{Z}{NP_r}$ |
| $y_{min}$ | 0 | 0 |
| $y_{max}$ | Z | 1 |
| $Q_r$ | $Z\, m_p q_{pr}$ | $m_p q_{pr}$ |
| | $\frac{Z}{NP_r} m_n q_n$ | $\frac{1}{NP_r} m_n q_n$ |
| $Q_{PLi}$ | $\eta_{PLi} m_n q_n (1-\eta_n)$ | $\eta_{PLi} m_n q_n (1-\eta_n)$ |
| Stoichiometry | $y - Z - NP_r x$ | |

In certain aspects, an electrochemical cell incorporating a lithiated electroactive material with a protective coating prepared in accordance with certain methods of the present disclosure may have an N/P ratio (negative electrode capacity to positive electrode capacity for lithium) of greater than or equal to about 1.5 to less than or equal to about 2. By controlling the N/P ratio with prelithiation, the voltage window for silicon-based electrodes can be fine-tuned and optimized. For example, a voltage window for silicon may range from about 0.465V to about 0.076V.

Example 1

Silicon negative electrodes formed of 80 wt. % active material (uncoated Si or lithiated and ALD coated Si), 10 wt. % carbon black and 10 wt. % binder are prepared. Super P is used as the carbon black and polyimide as the binder. The active material and carbon black are first mixed using standard electrode mixing machine, and then mixed with the binder solution using a mixer. The electrode slurries are then coated on Cu foils and dried under vacuum at 250° C. overnight.

The ALD coating process was conducted on the silicon electrode directly. The deposition temperature for $Al_2O_3$ coating is 200° C. Trimethyl-aluminum is used as the Al precursor and $H_2O$ as the O precursor. Both precursors are heated at 80° C. during the deposition process. The exposure time and pump down time for each precursor is 10 seconds and 20 seconds.

Both the comparative uncoated silicon negative electrode and silicon negative electrode having an $Al_2O_3$ ALD coating are prelithiated electrochemically.

Coin-type battery half-cells (2032) are fabricated inside an Ar-filled glovebox using the silicon-containing electroactive materials as working electrodes and lithium (Li) foil as a counter electrode. An electrolyte comprising 1M $LiPF_6$ in fluoroethylene carbonate (FEC) and ethylmethyl carbonate (EMC) (FEC:EMC=1:4 by weight), along with a Celgard™ 2320 separator. The silicon working electrodes are formed by including the silicon-containing electroactive particles mixed with a polyimide binder and a Super P carbon black in a weight ratio of 80:10:10.

The battery half-cell is then tested to determine capacity retention over various charge/discharge cycles. More specifically, galvanostatic cycling is performed using an Arbin cycler, including 2 formation cycles at a charge/discharge rate of C/20 followed by cycling at C/5. The galvanostatic voltage cutoffs are 3.0 V and 4.2 V versus Li/Li+ for formation cycles and 3.0 V and 4.2 V versus Li/Li+ for the C/5 cycling. The N/P ratio is 2 for the silicon electrode which combines ALD coated $Al_2O_3$ coating and the prelithiation process according to certain aspects of the present disclosure.

FIG. 9 shows comparative full cell data for a silicon electrode which combines ALD $Al_2O_3$ coating and prelithiation, showing that the ALD coating can significantly improve cycle stability with desirable areal capacity (>4 mAh/cm$^2$). Comparative discharge capacity (in mAh/cm$^2$) on y-axis 450 and discharge capacity retention (%) performance on y-axis 452 versus cycle number/index (460) as an x-axis. More specifically, performance of negative electrodes in a half-cell having a comparative uncoated silicon 470 and a treated silicon particle 472 having an ALD coating (both samples were prelithiated before cell assembly) prepared in accordance with certain aspects of the present disclosure are shown.

As can be seen, uncoated comparative silicon-containing electrodes 470 have a rapid decline in discharge capacity and only have 35% capacity retention after 270 cycles. For a treated silicon-containing electroactive material particle 472 subjected to an ALD step and lithiation in accordance with certain aspects of the present disclosure, capacity retention is about 70% at 270 cycles, which is significantly enhanced as compared to the comparative examples.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making a negative electrode for an electrochemical cell that cycles lithium ions, the method comprising:
    applying a protective coating via an atomic layer deposition (ALD) process onto a silicon-based negative electrode precursor material in a first reaction chamber of a reactor, wherein the protective coating is selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), lithium fluoride (LiF), aluminum fluoride ($AlF_3$), aluminum oxyfluoride (AlFO), aluminum nitride (AlN), silicon nitride (SiN), and combinations thereof; and then
    transferring the silicon-based negative electrode precursor material into a second reaction chamber of the reactor and lithiating the silicon-based negative electrode precursor material by a thermal evaporation process to form a negative electrode material comprising the protective coating and a lithium-containing coating,
    wherein applying the protective coating to the silicon-based negative electrode precursor material and lithiating the silicon-based negative electrode precursor material are performed in a continuous process respectively in the first reaction chamber and the second reaction chamber of the reactor.

2. The method of claim 1, wherein a thickness of the lithium-containing coating is greater than or equal to about 1 micrometer to less than or equal to about 50 micrometers.

3. The method of claim 1, wherein the first reaction chamber defines a plurality of deposition regions, and wherein each of the plurality of deposition regions comprises a first zone to introduce an oxidant and a second zone to introduce one or more ALD precursors.

4. The method of claim 1, wherein the reactor is a vacuum chamber defining the first reaction chamber and the second reaction chamber.

5. The method of claim 1, wherein a thickness of the protective coating is greater than or equal to about 1 nm to less than or equal to about 25 nm.

6. The method of claim 1, wherein the method is conducted continuously in a roll-to-roll process.

7. The method of claim 1, wherein the silicon-based negative electrode precursor material consists of silicon (Si), a Si—Sn alloy, a Si—Sn—Fe alloy, a Si—Sn—Al alloy, a Si—Fe—Co alloy, or a combination thereof.

8. The method of claim 1, wherein the silicon-based negative electrode precursor material comprises a plurality of electroactive material particles.

9. The method of claim 8, further comprising: mixing the negative electrode material with a polymeric binder to form a slurry, and then applying the slurry to a substrate.

10. The method of claim 8, wherein the silicon-based negative electrode precursor material is a pre-formed composite electrode including a plurality of electroactive material particles distributed in a polymeric matrix.

11. The method of claim 1, wherein the silicon-based negative electrode precursor material has a surface, and wherein, prior to applying the protective coating onto the silicon-based negative electrode precursor material, treating the surface with oxygen plasma or peroxide ($H_2O_2$) to form a plurality of hydroxyl groups (OH) on the surface.

12. The method of claim 1, wherein the protective coating is selected from the group consisting of: titanium dioxide ($TiO_2$), vanadium pentoxide ($V_2O_5$), hafnium dioxide ($HfO_2$), tin oxide ($SnO_2$), zinc oxide (ZnO), aluminum oxyfluoride (AlFO), aluminum nitride (AlN), silicon nitride (SiN), and combinations thereof.

13. The method of claim 1, wherein the protective coating is selected from the group consisting of: vanadium pentoxide ($V_2O_5$), silicon nitride (SiN), and combinations thereof.

14. The method of claim 1, further comprising:
    assembling the negative electrode material into a battery having a laminated structure comprising an anode layer, a cathode layer, an electrolyte, and a separator between the anode layer and the cathode layer, wherein the anode layer comprises the negative electrode material.

15. A method of making an electrode for an electrochemical cell that cycles lithium ions, the method comprising:
    applying a protective coating to a silicon-based electrode precursor material, and lithiating the silicon-based electrode precursor material in a continuous process conducted in a reactor having a first reaction chamber and a second reaction chamber to form a lithiated electrode material comprising the protective coating,
    wherein the protective coating is selected from the group consisting of: aluminum oxide ($Al_2O_3$), titanium dioxide ($TiO_2$), silicon dioxide ($SiO_2$), vanadium pentoxide ($V_2O_5$), zirconium dioxide ($ZrO_2$), hafnium dioxide ($HfO_2$), tin oxide ($SnO_2$), zinc oxide (ZnO), lithium fluoride (LiF), aluminum fluoride ($AlF_3$), aluminum oxyfluoride (AlFO), aluminum nitride (AlN), silicon nitride (SiN), and combinations thereof,
    wherein the protective coating is applied to the silicon-based electrode precursor material in the first reaction chamber by an atomic layer deposition (ALD) process and the silicon-based electrode precursor material is subsequently lithiated in the second reaction chamber by a thermal evaporation process, and
    wherein the first reaction chamber defines a plurality of deposition regions that each comprise a first zone to introduce an oxidant and a second zone to introduce one or more ALD precursors.

16. The method of claim 15, wherein the reactor is a vacuum chamber defining the first reaction chamber and the second reaction chamber.

17. The method of claim 15, wherein a thickness of the protective coating is greater than or equal to about 1 nm to less than or equal to about 25 nm.

18. The method of claim 15, wherein the method is conducted continuously in a roll-to-roll process.

19. The method of claim 15, wherein the protective coating is selected from the group consisting of: titanium dioxide ($TiO_2$), vanadium pentoxide ($V_2O_5$), hafnium dioxide ($HfO_2$), tin oxide ($SnO_2$), zinc oxide (ZnO), aluminum oxyfluoride (AlFO), aluminum nitride (AlN), silicon nitride (SiN), and combinations thereof.

20. The method of claim 15, wherein the protective coating is selected from the group consisting of: vanadium pentoxide ($V_2O_5$), silicon nitride (SiN), and combinations thereof.

* * * * *